United States Patent [19]

Groth, Jr.

[11] Patent Number: 4,494,238
[45] Date of Patent: Jan. 15, 1985

[54] MULTIPLE CHANNEL DATA LINK SYSTEM

[75] Inventor: Edward J. Groth, Jr., Scottsdale, Ariz.

[73] Assignee: Motorola, Inc., Schaumburg, Ill.

[21] Appl. No.: 393,833

[22] Filed: Jun. 30, 1982

[51] Int. Cl.³ .............................................. H04B 7/02
[52] U.S. Cl. ........................................ 375/1; 375/40;
455/52; 455/59; 455/315
[58] Field of Search ...................... 375/1, 40, 100, 2.1;
455/49, 50, 52, 59, 63, 137, 139, 314, 315, 316;
371/68; 370/19; 178/22.01, 22.1, 22.12, 22.13,
22.14, 22.16

[56] References Cited

U.S. PATENT DOCUMENTS

| | | | |
|---|---|---|---|
| 3,214,691 | 10/1965 | Sproul et al. | 455/52 |
| 3,593,147 | 7/1971 | Gurak et al. | 455/139 |
| 3,624,513 | 11/1971 | Costas | 455/315 |
| 3,714,573 | 1/1973 | Grossman | 375/1 |
| 4,063,173 | 12/1977 | Nelson et al. | 455/315 |
| 4,146,838 | 3/1979 | Takada | 455/63 |
| 4,361,891 | 11/1982 | Lobenstein et al. | 375/1 |

Primary Examiner—Benedict V. Safourek
Attorney, Agent, or Firm—Eugene A. Parsons

[57] ABSTRACT

A coherent communications link for simultaneously transmitting intelligence on a plurality of non-contiguous frequency channels by means of a plurality of coherent carrier signals which are connected to a single composite intermediate frequency signal upon reception by a fully coherent receiver. The local oscillator signals in the receiver are maintained coherent with respect to the transmitted carrier signals responsive to the composite IF signal while each of the local oscillator signals is adjusted to maintain coherence of each received carrier in the face of relatively long term drift due to thermal shifts, path effects and hardware drift.

32 Claims, 12 Drawing Figures

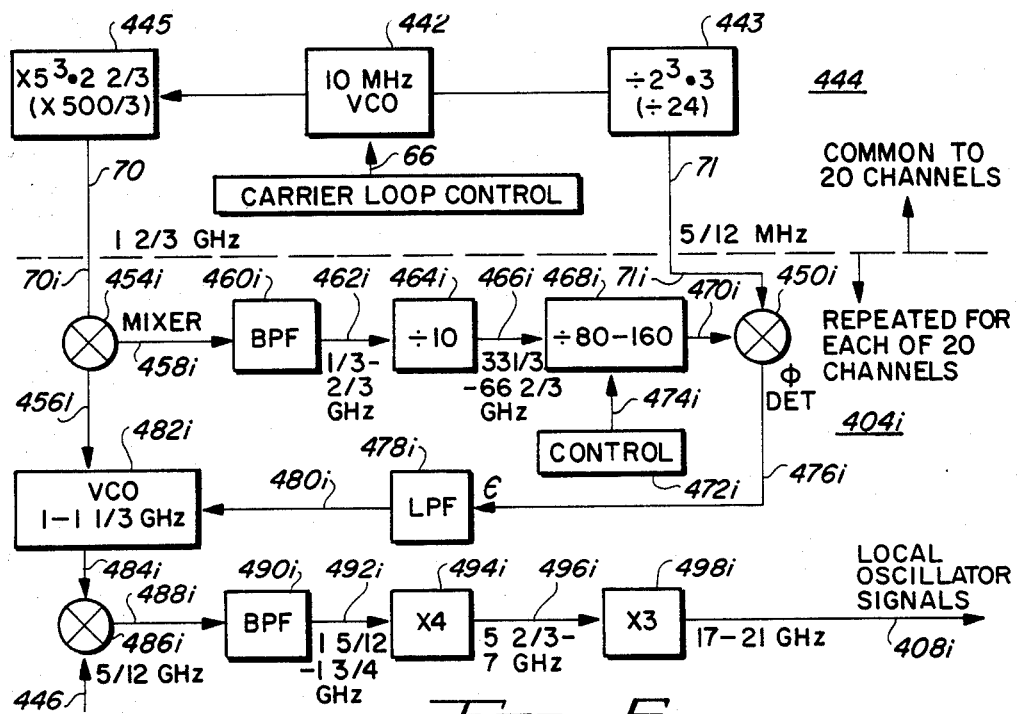
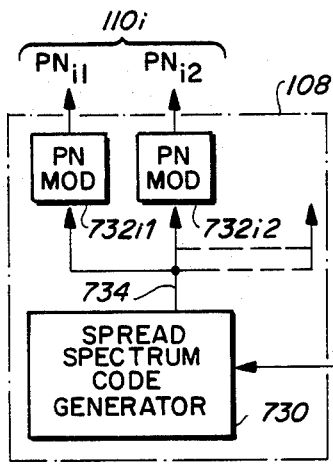
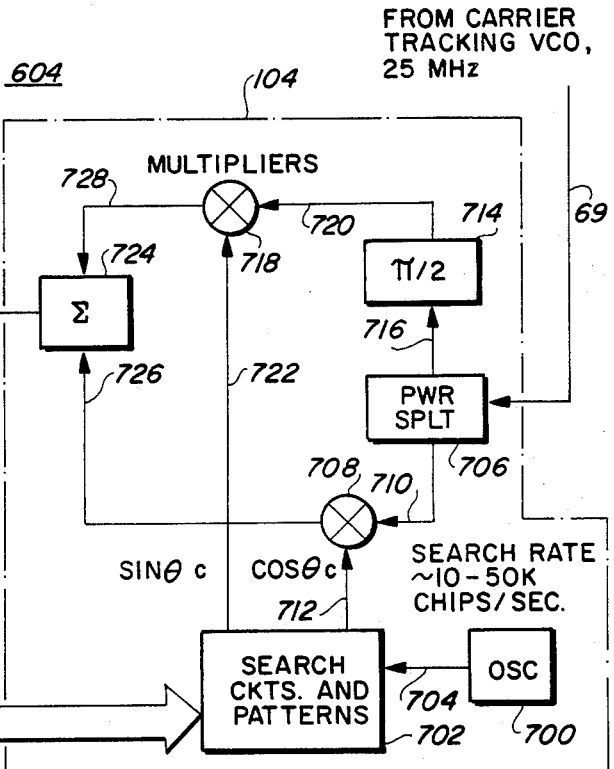
FIG-5
FIG-8

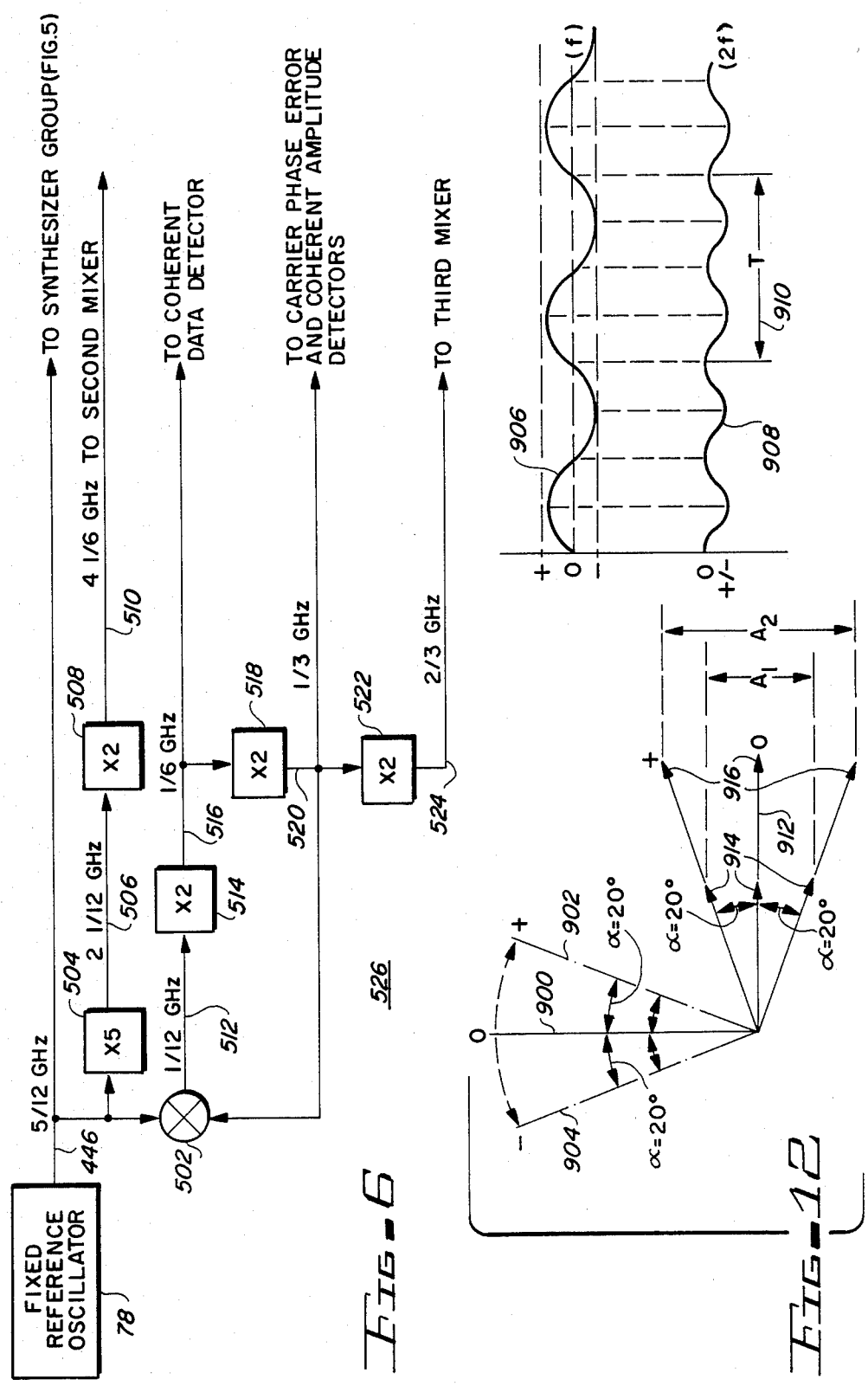

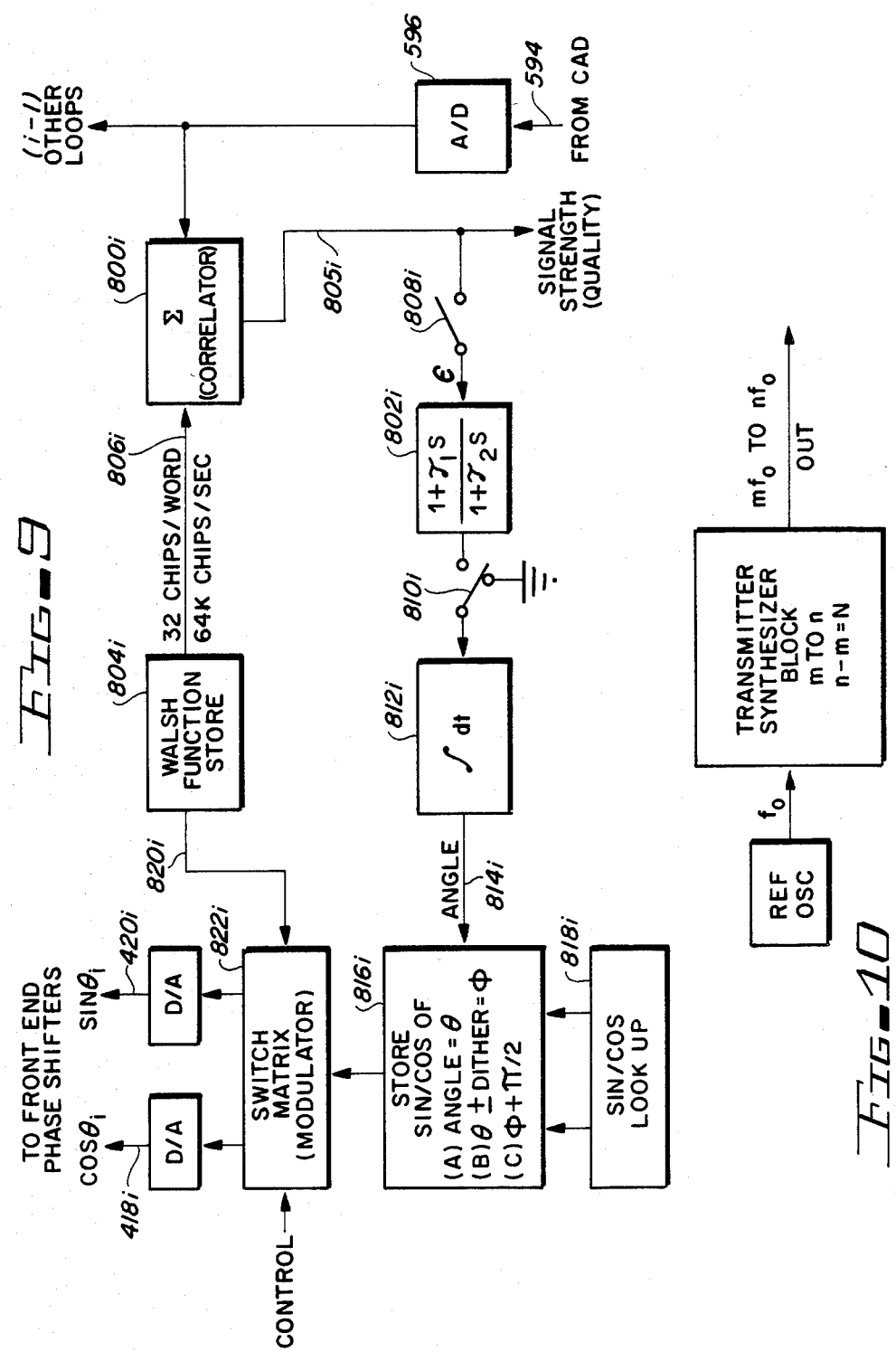

ns system
which simultaneously employs a plurality of redundant
communication channels and coherently related carriers and clocks in the transmitted channels and coherently sums the received signals prior to detection in the
processing scheme in the receiver.

BACKGROUND OF THE INVENTION

The datalink problem, which is solved by the instant
invention, has been defined in the past as one having an
extremely high data rate and a high incidence of manmade noise in the environment in which it is employed.
The problem has been attacked by one of at least two
approaches: (1) A frequency hopping (FH) system in
which only one of many channels of transmission is
used at a time and (2) a pseudo noise (PN) system in
which a spread spectrum is utilized in order to disperse
the signal in a single broad band channel in order to
reduce the effects of interference. It would appear reasonably obvious to combine these two techniques in a
single FH/PN system.

Because of the extreme bandwidths required for any
of these systems, it is becoming more and more difficult
to allot large enough contiguous sectors of the spectrum
to such systems. FH and FH/PN systems may be operated, to some degree, in smaller multiple and non-contiguous sectors but this is not possible for the PN systems. This concept of spectrum assignment wil be referred to as "frequency management", herein.

Certain hypothetical parameters will be assumed
throughout the balance of this disclosure for purposes
of illustration only. It will be assumed that the frequency range within which the transmission of datalink
communications must occur is from 12 to 16 GHz. The
data rate will be assumed to be 0.5 megabits per second
with a bit error rate (BER) of less than $10^{-5}$. If a single
channel system were to be used, the bandwidth would
be assumed to be limited to 1 GHz null to null, the code
chip rate (in a PN system) 500 megachips per second;
the processing gain, 500 megachips per 0.5 megabits
equalling 1000, or 30 db. It will be further assumed that
the total average radiated power must be at least 25 db
above a noise-free environment in order to assure reliable communications. In current state-of-the art systems
(above) the single channel bandwidth is indicated at 1
GHz. It is probable that as the spectrum becomes more
and more crowded with competing electronic signals it
will become more and more difficult to allot as much as
1 GHz to a single channel in a contiguous portion of the
spectrum. If as many as four systems are employed, that
is, the four systems occupy four different one GHz
ranges within the 4 GHz alloted for the purpose, it may
be seen immediately that the 4 GHz spectrum is completely filled. It is even less realistic to expect that the
full 4 GHz spectrum will be available for such transmissions. The frequency management problem is, at least,
severe.

It is also desirable that the system use as little spectrum as is necessary to accomplish the end result required, namely, good data communications. In those
applications where interference-free communications
are required, it is another desirable aspect of such a
system to reduce detection susceptibility. The system
should deny intelligence of the utilized spectrum to
those who would interfere. If, at the same time, the
power demands of the system can be reduced, this is
also desirable.

Single channel systems also demonstrate fade margin
problems. That is, since any single channel system is
susceptible to varying power levels at the input of the
receiver thereof, it is necessary to operate at increased
power to guarantee reliable communications under
worst case fade conditions. Clearly it would be helpful
if system power could be reduced under these conditions.

Another technique commonly used to reduce the
effect of man-made noise in a datalink system is the
employment of a null steering antenna in order to minimize the noise input with respect to the required or
desired signal input. Such systems are complex and
expensive and clearly it would be of advantage to eliminate such devices from such a system.

SUMMARY OF THE INVENTION

The above named and other problems of the prior art
systems have been either much reduced or completely
solved by the invention described herein. The transmitter of the invention transmits on a multiple channel
basis. That is, the same data is transmitted simultaneously on a plurality of channels. The channels are
picked according to the available channels in the spectrum. Typically, the number of transmitted channels
may be about 20; this is the number that will be used in
the preferred embodiment example set forth herein.
Modulation is in the form of data combined with spread
spectrum PN codes wherein a master code is used for all
channels but each transmitted modulated signal has that
master code modified by a circuit which provides a
unique PN code for each channel. The entire transmitter system is coherent. (Identical data is modulated on
each active channel.) This is accomplished by means of
frequency synthesis based upon a single reference oscillator. It may be seen that in the 12 to 16 GHz range
there are eighty 50 megahertz-wide channels available
wherein the system of the invention uses no more than
20 of them in order to operate and may operate satisfactorily with only one. Therefore, any particular channel
which demonstrates an excessive noise level may be
switched to one of the 60 unused channels in order to
avoid the noise. It is important to note that each of the
20 transmitted channels carries the same data information. If only one of the 20 channels is clear, the data may
be transmitted reliably on that single channel. In order
to take advantage of the processing gain available from
all of the channels, the receiver is configured as a coherent receiver. Preferably, all 20 channel signals are received in a single antenna which is broad band, and
applied to a broad band power splitter. There may or
may not be a signal amplifier before the splitter in order
to compensate for losses in the splitter. The output of
the receiver splitter is 20 channels, each having all of
the information from all 20 carrier channels. Each of the
20 channels is fed through a converter which may be an
up or down converter and converted to a single IF
conversion frequency. In the example this frequency is
5 GHz. The local oscillator signals which are required
to make this 20 channel conversion are all derived from
the same voltage controlled oscillator through a coherent synthesizer and the configuration is such that the
local oscillator frequencies are coherent with the received frequencies. This is an important aspect of the system design since, if the local oscillator frequencies were arranged to be coherent only with each other, Doppler shift at the various incoming frequencies would appear as different phase shifts on the different channel contributions in the IF portion of the receiver. The 20 channels of IF are combined in a summer and then amplified and detected in a fairly conventional manner in a triple conversion system. An important feature of the invention is that summing occurs prior to detection. The output of the last IF amplifier is fed to a phase lock loop wherein the composite carrier at the IF frequency is compared to a reference frequency in a phase detector. The phase detector output signal is passed through a low pass filter to generate an error signal which controls a VCO in the synthesizer which, in turn, controls all of the local oscillator frequency signals.

The above covers, in a broad fashion, the method used in the receiver to get good processing gain out of the 20 channel system. However, some small, slow phase variations which occur between channels must still be corrected. Twenty corrector loops, one for each channel, are provided to take care of the slower variations caused by phase shifts due to path length effects at the different carrier frequencies (dispersion), thermal shifts within the equipment, and long term shifts in hardware values.

It must also be understood that superimposed on each transmitted carrier signal is a data signal which is PN coded. It has already been stated that each PN code is uniquely different from every other one in each of the 20 channels. The receiver must reconstruct the basic PN code, modify the basic code in 40 different ways (it will be seen that 40 modifications of the PN code are used) and apply these codes to the 20 coherent local oscillator frequencies in such a way as to despread all 20 input channels coherently. This modulation system is inserted between the outputs of the synthesizers for the local oscillator frequencies and the inputs to the 20 mixers which provide down conversion and despreading of the signals from the power splitter in the front end of the receiver. This demodulating scheme will be treated in more detail later.

Since much of the system is configured in a digital manner, a single microprocessor is utilized to perform many of the functions in the system. The digital subsystem loops are functions incorporated in a microprocessor. Analog to digital and digital to analog converters are used at the interfaces of the microprocessor in order to provide proper conversion from the digital sections of the system to the analog sections of the system, and vice versa.

The microprocessor is also utilized to control system channel assignments in the receiver. If the receiver senses a noise level which is excessive in any of the 20 transmission channels, that channel may be selected for turn-off. In a two-way system where information may be fed back to the transmitter on a reverse link, the transmitter channel frequencies may actually be changed; i.e., a different channel selected and substituted for the noisy channel under control of the reverse link. This system may be entirely automated in a two-way system. With the above capability, it will be understood that the system of the invention is adaptive, responsive to the effects of interference.

It is, therefore, an object of the invention to provide a transmitter and receiver for a data link employing multiple simultaneous coherent channels which may be non-contiguous and wherein the receiver is completely coherent with respect to the transmitted channels.

It is another important object of the invention to provide a receiver having multiple channel capability wherein the local oscillators for each channel are coherent with respect to the transmitted signals.

It is still another important objective of the invention to provide a system wherein any one of a plurality of channels which is subject to interference may be ignored by the receiver or shifted to another carrier frequency by the transmitter.

These and other important objects of the invention will be better understood upon review of the detailed description, below, taken together with the figures in which:

FIG. 5 is a block diagram of the synthesizer portion of FIG. 4;

FIG. 6 is a block diagram of the receiver reference sources of FIG. 2;

FIG. 8 is a block diagram of a code generator and clock control for the receiver of FIG. 1;

FIG. 9 is a block diagram of digital subsystem and loops which may be a part of the receiver of FIG. 1;

FIG. 10 is a conceptual block diagram of the transmitter of the invention;

FIG. 11 is a conceptual block diagram of the receiver of the invention; and

FIG. 12 is a graphic representation of normalized dither characteristics of certain of the signals of FIG. 9.

DETAILED DESCRIPTION OF THE INVENTION

Figure 1:
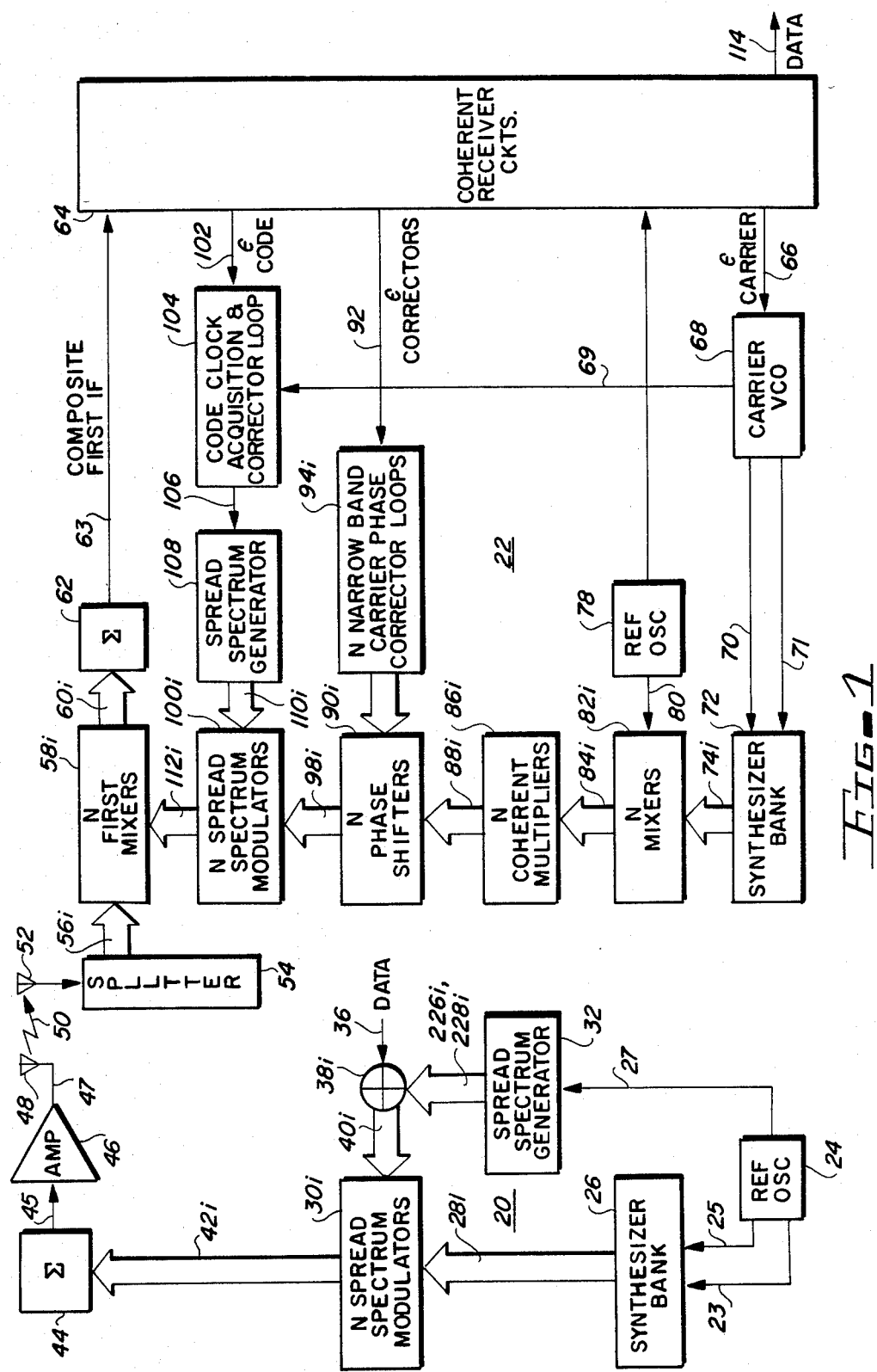
FIG. 1 is a block diagram of a system embodiment of the invention, including a transmitter and a receiver.

NOTE: Where identical reference numerals or characters are used to describe portions of the various figures, it will be understood that such portions are identical. Where a reference numeral is followed by the character "i", it will be understood that there are i units of the same type and that only one is shown. In the example of the best embodiment of the invention described below, "i" will indicate each one of 20 channels.

Referring now to FIG. 1, it will be seen that transmitter 20 and receiver 22 are shown therein in block diagram form. It may be seen that reference oscillator 24 drives synthesizer bank 26 via lines 23 and 25. Reference oscillator 24 also drives spread spectrum generator 32 by means of line 27. Of course, it will be understood that reference oscillator 24 is a stable oscillator, probably crystal controlled. Synthesizer bank 26 produces 20 line output $28i$ where each of the 20 lines represents the carrier frequency for 20 different carriers. Channel assignment for each of the 20 carriers is predetermined, as will be shown below. Output line 27 from reference oscillator 24 is the clock signal for spread spectrum generator 32. Spread spectrum generator 32 has a 40 line output $226i$, $228i$. Each pair of lines feeds a signal pair to one of modulators $38i$ wherein data on line 36 is mixed with the outputs of the spread spectrum generator 32 to provide composite signals $40i$. Spread spectrum modulators 30i are fed from lines 28i from synthesizer bank 26 and lines 40i from modulators 38i to provide 20 carriers 42i in 20 different channels. Each channel has a carrier frequency modulated by both data and spread spectrum pseudo-noise. All 20 sets of signals 42i are fed to summer 44 and then via line 45 to power amplifier 46 and via line 47 to antenna 48 where the composite signal is transmitted 50.

It should be noted that although 20 different channels are being transmitted, their carriers and data as well as the spread spectrum PN signals are all coherent in the embodiment of this example.

The composite signal 50 is received in receiver 22 antenna 52. The signal is then applied to splitter 54 which splits the power 20 ways and produces 20 different signals in line 56i. The 20 signals, all of which are identical, are fed to first mixers 58i. Local oscillator signals 112i are also fed to first mixers 58i to produce 20 different intermediate frequency (IF) signals on lines 60i. Lines 60i are fed to summer 62 and a first IF composite signal is produced on line 63, the output of summer 62. In the preferred embodiment of the invention, this composite IF signal is fed through 2 more stages of conversion, but for clarity in the block diagram of FIG. 1 the composite signal is being shown fed to coherent receiver circuits 64. A carrier error signal, $\epsilon$, is produced on line 66 to control carrier voltage controlled oscillator (VCO) 68. One output of carrier VCO 68 is sent via lines 70 and 71 to synthesizer bank 72. Synthesizer bank 72 produces 20 local oscillator signals 74i. These signals are sent to mixers 82i and are mixed with a signal on line 80 from reference oscillator 78, a fixed frequency oscillator. The outputs of mixers 82i are sent via lines 84i to coherent multipliers 86i. The outputs of coherent multipliers 86i are sent via lines 88i to phase shifters 90 where the signal is phase shifted under control of on lines signals 96i from narrow band carrier phase corrector loops 94i. Each of these loops is controlled by error corrector signal, $\epsilon$, on line 92. The signal on line 92 is derived from coherent receiver circuits 64. The phase shifted outputs of phase shifters 90i are sent via lines 98i to spread spectrum modulators 100i. Spread spectrum modulators 100i are spread spectrum signals from lines 110i which are generated by spread spectrum generator 108 under control of a code clock carried by line 106 from code clock acquisition and corrector loop 104. Code clock acquisition and corrector loop 104 is also fed by a signal on line 69 from carrier VCO 68 and an error of code timing on line 102 from coherent circuits receiver 64. The output of spread spectrum modulators 100i are fed via lines 112i to first mixers 58i as previously described. In summary, the error signal on line 69 corrects for Doppler shifts; it has wideband dynamics. The error signal on line 102 is used for narrow band trimming. In effect, line 69 provides rate aiding of the clock loop which is controlled in the narrow band sense by line 102. This completes the description of FIG. 1.

Figure 2:
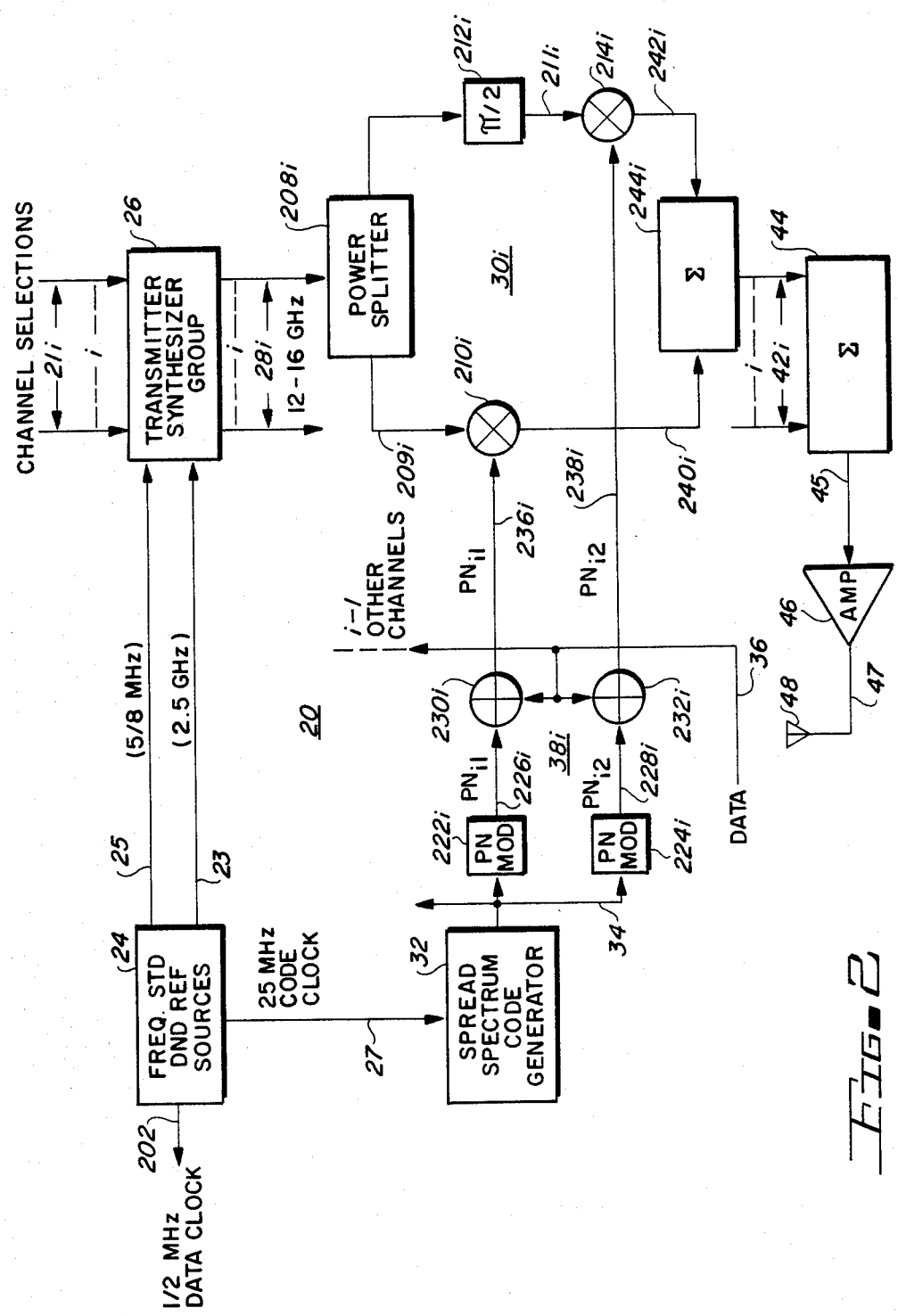
FIG. 2 is a block diagram of the transmitter of FIG. 1.
Figure 3:
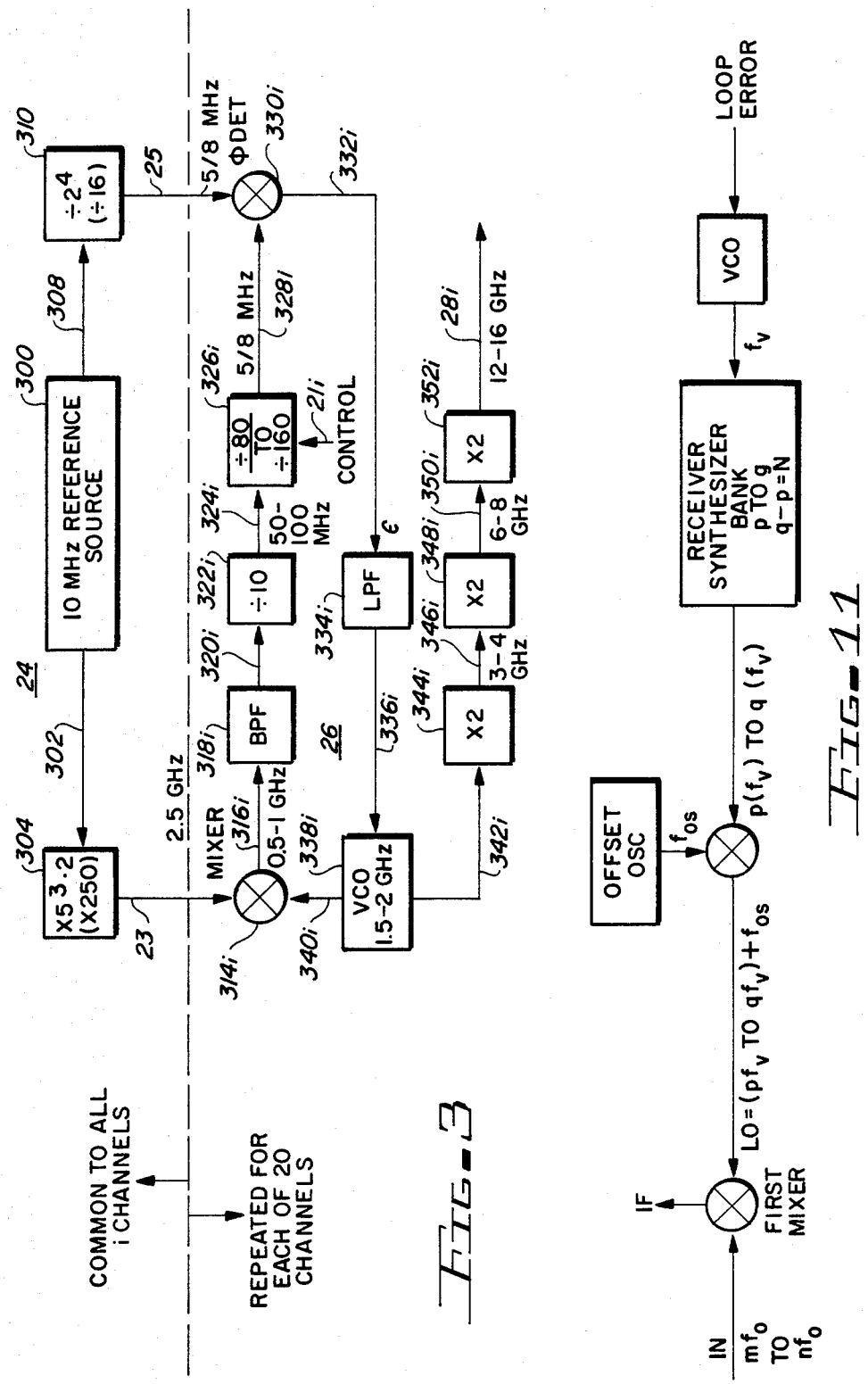
FIG. 3 is a more detailed block diagram of the synthesizer of FIG. 2.

Transmitter 20 of FIG. 1 is more completely described in FIGS. 2 and 3 and receiver 22 is further described in FIGS. 4–9.

Referring first to FIG. 2, it will be noted that frequency standard and reference sources 24 supplies a $\frac{1}{2}$ MHz data clock on line 202, a $\frac{5}{8}$ MHz signal on line 25, a 2.5 GHz signal on line 23 and a 25 MHz code clock on line 27. Reference standard 24 is shown in more detail in FIG. 3. Line 202 carrying the $\frac{1}{2}$ MHz data clock signal may be used to control the clock rate of a data generator (not shown). The $\frac{5}{8}$ MHz signal on line 25 and the 2.5 GHz signal on line 23 are sent to transmitter synthesizer 26. Lines 21i are used to control transmitter synthesizer 26 to select 20 channels out of the 80 channels which are available. This selection may be done manually or it may need to be done in response to a signal from receiver 22, which will be discussed in more detail, supra. Transmitter synthesizer 26 is shown in more detail in FIG. 3. The output of transmitter synthesizer 26 comprises 20 lines 28i and each line carries a carrier signal in the range of from 12 to 16 GHz. Each of lines 28i is fed to a power splitter 208i, one of 20. One output of power splitter 208i goes to a $\pi/2$ phase shifter 212i. The output of $\pi2$ phase shifter 212i is fed to biphase modulator 214i via line 211i. The other output of power splitter 208i is fed to another biphase modulator 210i, via line 209i. Output 240i of modulator 210i and output 242i of modulator 214i are combined in power combiner 244i.

Figure 4:
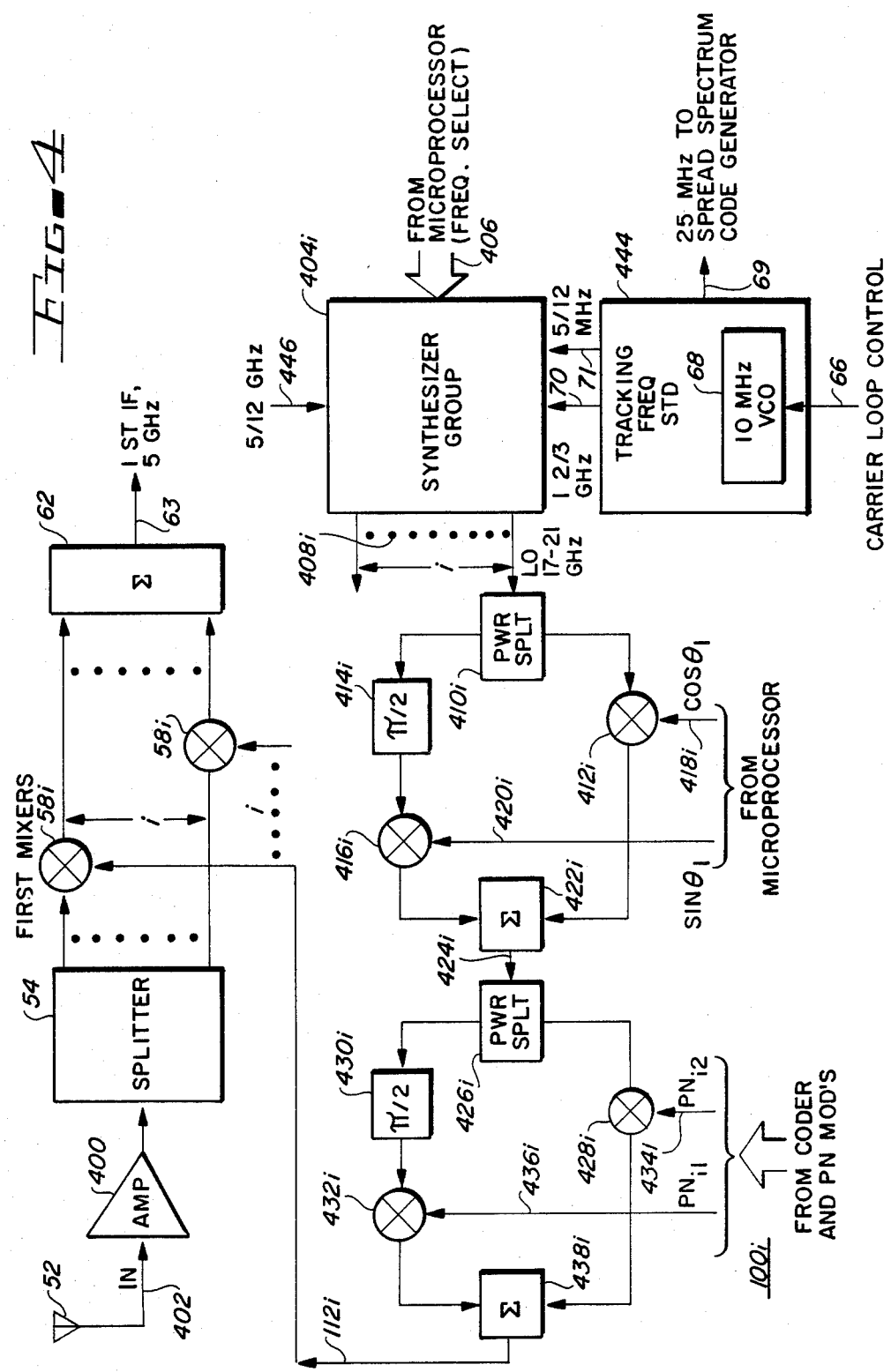
FIG. 4 is a block diagram of a portion of the receiver of FIG. 1.

As has been previously stated, frequency standard 24 produces a 25 MHz code clock on line 27. This line is fed to spread spectrum code generator 32. The output of spread spectrum code generator 32 is fed to 20 pairs of pseudo-noise modifiers 222i and 224i. Line 34 transmits a signal to the pseudo-noise (PN) modifiers 222i, 244i. Only one pair, 222i, 244i, of these modifiers is shown in FIG. 2. However it will be understood that there are 19 more pairs of such amplifiers for the i−1 other channels. Output PNi1 of PN modifier 222i is transmitted on wire 226i to modulator 230i. Output PNi2 of PN modifier 224i is transmitted on line 228i to modulator 232i. These modulators may be exclusive OR combiners. An input from line 36 carrying data from a data source (not shown) is applied to the other inputs of each of modulators 230i and 232i. The output of modulator 230i is transmitted on line 236i to mixer 210i, part of bi-phase modulator 30i. The output of modulator 232i is transmitted on line 238i to mixer 214i, also part of bi-phase modulator 30i. It has already been described how the outputs of modulators 210i and 214i are added in adder 244i to form a composite signal. The output of adder or summer 244i is applied via line 42i to summer 44 where it is added to the signals on all lines 42i from the other 19 bi-phase modulators 30i. The output of adder 44 is sent via line 45 to power amplifier 46. The output of amplifier 46 is applied via line 47 to antenna 48 whereby it is transmitted to the receiver (FIG. 4).

FIG. 3 describes (in more detail) transmitter synthesizer 26 and frequency standard 24 of FIG. 2. It may be seen that transmitter frequency standard 24 comprises a 10 MHz reference source 300 which feeds a 10 MHz signal on line 308 to $\div 16$ circuit 310. The output of $\div 16$ circuit 310 is a $\frac{5}{8}$ MHz signal on line 25. 10 MHz reference source 300 also feeds a 10 MHz signal on line 302 to $\times 250$ circuit 304. The output of $\times 250$ circuit 304 appears on line 23 as a 2.5 GHz signal. What has been described to this point is common for all i channels of the transmitter system. The remainder of the circuit in FIG. 3 is repeated 20 times, once for each of the channels of the preferred embodiment of the transmitter.

2.5 GHz signal on line 23 is fed to mixer 314i where it is mixed with a signal from line 340i. The output of mixer 314i on line 316i is a signal which may vary from 0.5 to 1 GHz. The signal on 316i is fed to band pass filter 318i. The purpose of bandpass filter 318i is to eliminate the output components of mixer 314i which are outside the range of from 0.5 to 1 GHz. The output of bandpass filter 318i is fed via line 320i to $\div 10$ circuit 322i. The output of $\div 10$ circuit 322i is a 50 to 100 mHz signal on line 324i which is fed to divider 326i. Divider 326i is controllable in the range of from ÷80 to ÷160. Control is provided on line 21i. The output of circuit 326i is a ⅝ MHz signal on line 328i. This ⅝ MHz signal is fed to phase detector 330i and is mixed with a ⅝ MHz signal from ÷16 circuit 310 on line 25. The output of phase detector 330i is presented on line 332i as an error signal, ε. Error signal, ε, may vary above and below 0 volts and is a DC signal. Error signal, ε, on line 332i is fed through low pass filter 334i to eliminate any noise component which may be present. The output of low pass filter 334i is fed on line 336i to voltage controlled oscillator (VCO) 338i. Voltage controlled oscillator 338i may be varied from 1.5 to 2.0 GHz by means of the error signal, ε, on line 336i. The output of voltage controlled oscillator 338i is passed by means of line 340i to mixer 314i. It may be seen that the mixing of the 2.5 GHz signal on line 23 and 1.5 to 2.0 GHz on line 340i produces the required 0.5 to 1.0 GHz range of signals on the output of mixer 314i at line 316i as previously described. The 1.5 to 2.0 GHz signal is also presented on line 342i out of voltage controlled oscillator 338i. This signal is fed to ×2 circuit 344i. The output of ×2 circuit 344i is a 3 to 4 GHz signal on line 346i. This signal is fed to another ×2 multiplier 348i whose output appears on line 350i and lies in the range from 6 to 8 GHz. This signal in turn is fed to still another ×2 multiplier 352i whose output appears on line 28i and lies in the range of from 12 to 16 GHz. These are the signals which appear on lines 28i of FIG. 2.

This completes the detailed description of the circuits of the preferred embodiment of the transmitter of the invention.

As shown in FIG. 1, the signal from transmitter antenna 48 is transmitted 50 to antenna 52 of the receiver. The receiver is shown in more detail beginning with FIG. 4.

The signal from receiver antenna 52 is fed via input line 402 to amplifier 400. Amplifier 400 is an RF amplifier which is used to raise the level of the signal prior to its application to power splitter 54. Power splitter 54 splits the signal into 20 identical channels and each of these 20 channels is fed respectively to one of 20 first mixers 58i. The output of mixers 58i are fed to summing circuit 62. It will be shown that with proper selection of the local oscillator frequencies fed to mixers 58i, the output of summer 62 will be a composite first IF signal at 5 GHz on line 63. When the local oscillator signals (described in more detail in conjunction with FIG. 7) lines 112i are properly selected, the output of each of first mixers 58i will carry a component which is at 5 GHz. It is that component from each of mixers 58i which is combined in combiner or adder 62 to provide the composite first IF signal on line 63. It will also be shown that each of the component signals from first mixers 58i are coherent with respect to each other so that summer 62 provides a true addition of all 20 components. This addition is maximized when the phase of each local oscillator signal is properly corrected.

It must also be understood that in order for the outputs of first mixers 58i to be coherent it is necessary that the local oscillator signal inputs to mixers 58i are coherent with respect to the incoming signal. It would not be enough to make the local oscillator signals coherent with respect to one another, only. The reason for this requirement is that the local oscillators, of necessity, must be offset from the incoming frequency in order to provide an output signal from each of the mixers which is at 5 GHz rather than at some DC level. If local oscillator frequencies equal to the incoming frequencies were used, the output of summer 62 would be a DC signal which varied above and below zero. In that case, phase information would be difficult if not impossible to recover. This phase information is required in order to close the loop and provide correct local oscillator frequencies in terms of not only frequency, but also, phase. This, in turn, is a requirement in order to keep the system coherent.

Tracking frequency standard 444 produces a 5/12 MHz signal on line 71 and a 1⅔ GHz signal on line 70. It also produces a 25 MHz signal to spread spectrum code generator 604 on line 69. (See FIGS. 4, 7, 8.) Its control input is on line 66 and the carrier loop control error signal is fed via this line to 10 MHz VCO 442. The details of circuit 444 may be better understood upon study of FIG. 5. There it may be seen that circuit 444, used only once in the receiver, provides an error control signal on line 66 to 10 MHz VCO 442. One output of 10 MHz VCO 442 is fed to ÷24 circuit 443 which in turn produces a 5/12 MHz signal on line 71. Another output of 10 MHz VCO 442 is applied to ×500/÷3 circuit 445. Circuit 445 produces a 1⅔ GHz signal on line 70.

The 5/12 MHz signal on line 71 is expanded to 20 such lines labeled 71i in FIG. 5. The 1⅔ GHz signal provided on line 70 is likewise expanded to 20 such lines 70i in FIG. 5. 20 lines 70i and 71i are fed respectively from single lines 70 and 71. While circuit 444 is common to all 20 channels of the receiver, circuit 404i, that portion of FIG. 5 which is below the dotted line is repeated 20 times as has been explained before. The 1⅔ GHz signal from line 70i is fed to mixer 454i. It is mixed there with one output of voltage control oscillator 482i which has a range of from 1 to 1⅓ GHz. The ouput from mixer 454i on line 458i therefore has a range of from ⅔ GHz down to ⅓ GHz. This signal is fed through bandpass filter 460i and produces a ⅓ to ⅔ GHz signal on line 462i. This signal is divided by 10 in divider 464i and produces a signal which ranges from 33⅓ to 66⅔ MHz on line 466i. This signal is fed to divider 468i which has a dividing range of from 80 to 160. This range is controlled by means of control 472i via line 474i. 474i is a portion of the 406 bus and provides channel management from the microprocessor 600. The output of divider 468i on line 470i is a 5/12 MHz signal. The 5/12 MHz signals on line 470i and 70i are compared in phase detector 450i and an error signal, ε is produced at the output on line 476i. This signal passes through low pass filter 478i and line 480i to VCO 482i and is used to control the output of VCO 482i within the range of from 1 to 1⅓ GHz. The second output of VCO 482i is fed via line 484i to mixer 486i where it is mixed with a 5/12 GHz signal from line 446. (See also, FIG. 6.) The output of mixer 486i on line 488i is a signal which lies in the range of from 1 5/12 to 1¾ GHz. This signal is passed through bandpass filter 490i and line 492i to ×4 multiplier 494i. The output of multiplier 494i is a signal which ranges from 5⅔ to 7 GHz on line 496i. This signal is fed to ×3 multiplier 498i and its output is in the range of from 17 to 21 GHz on line 408i. Line 408i carries the local oscillator signals which are used in the receiver.

(Refer now to FIG. 4.) The local oscillator signals on lines 408i lie in the range of from 17-21 GHz. Each of these signals is fed to one of 20 power splitters 410i. Splitter 410i has two outputs, one to mixer 412i and one to π/2 phase shifter 414i which feeds another mixer 416$i$. The first output from splitter 410$i$ is mixed with a cos $\theta$i signal from microprocessor 600 (See also FIG. 7) and the output of mixer 412$i$ is fed to one input of summing circuit 422$i$. The output of $\pi/2$ phase shifter 414$i$ is fed to mixer 416$i$ where it is mixed with a sin $\theta$i signal from microprocessor 600 (again, see FIG. 7).

The outputs of mixers 416$i$ and 412$i$ are summed in summing circuit 422$i$ and fed to power splitter 426$i$. One output of splitter 426$i$ is fed to mixer 428$i$ where it is mixed with a PNi2 signal on line 434$i$. The output of mixer 428$i$ is fed to one input of summing circuit 438$i$. Another output of splitter 426$i$ is fed through $\pi/2$ phase shifter 430$i$ to one input of mixer 432$i$ where it is mixed with signal PNi1 from line 436$i$. PNi1 and PNi2 come from code generator 604 (see FIG. 7 where the PNi1 and PNi2 signals are shown on bus 110). (Bus 110 comprises all lines 434$i$ and 436$i$ of FIG. 4.) The output of mixer 432$i$ is fed to summing circuit 438$i$ and the output of summer 438$i$ appears on line 112$i$. The 20 signals on lines 112$i$ are fed to the 20 first mixers 58$i$ as corrected PN code modulated local oscillator signals.

It should be noted that the fixed reference oscillator 78 shown in FIG. 6 is the offset oscillator which provides a 5/12 GHz signal from which is derived the local oscillator frequencies, each of which is 5 GHz above the corresponding received incoming frequency. It must also be noted that while circuits 404$i$ (see FIG. 5) have a range of from 17 to 21 GHz, in use, each of the 20 circuits 404$i$ puts out a local oscillator signal which is 5 GHz above the corresponding incoming frequency at the antenna 52 (see FIG. 4) of the receiver. It may be seen, then, that this 5 GHz offset is the offset which produces the first IF frequency at 5 GHz.

A review of FIG. 6 will show how fixed reference oscillator 78 is used to generate other standard frequencies which are required in the receiver.

Fixed frequency oscillator 78 generates a 5/12 GHz signal on line 446. This is the same 5/12 GHz signal which appears on line 446 in FIG. 5. This signal is multiplied by 5 in multiplier 504 of FIG. 6 and produces a 2$\frac{1}{12}$ GHz signal on line 506. This signal is fed to $\times 2$ multiplier 508 which, in turn, produces a 4 1/6 GHz signal on line 510 which is transmitted to second mixer 552 of the receiver. (See FIG. 7). The 5/12 GHz signal on line 446 is also fed to mixer 502. The output of this mixer is a 1/12 GHz signal which is multipled by two in multipler 514 resulting in a 1/6 GHz output to coherent phase detector 568 on line 516. (See FIG. 7.) The 1/6 GHz signal on line 516 is also fed to times two multiplier 518 to generate a $\frac{1}{3}$ GHz signal on line 520. This $\frac{1}{3}$ GHz signal is fed to a second input of mixer 502 and also to carrier through a $\pi/2$ phase shifter 584, phase error 582 and coherent amplitude 580 detectors. (See, FIG. 7.) The $\frac{1}{3}$ GHz signal on line 520 is also fed to times two multiplier 522 to produce a $\frac{2}{3}$ GHz signal on line 524 which is transmitted to third mixer 560. (See FIG. 7.) Circuit 526 comprising all of FIG. 6 is shown in block diagram form as reference source 526 in FIG. 7.

Figure 7:
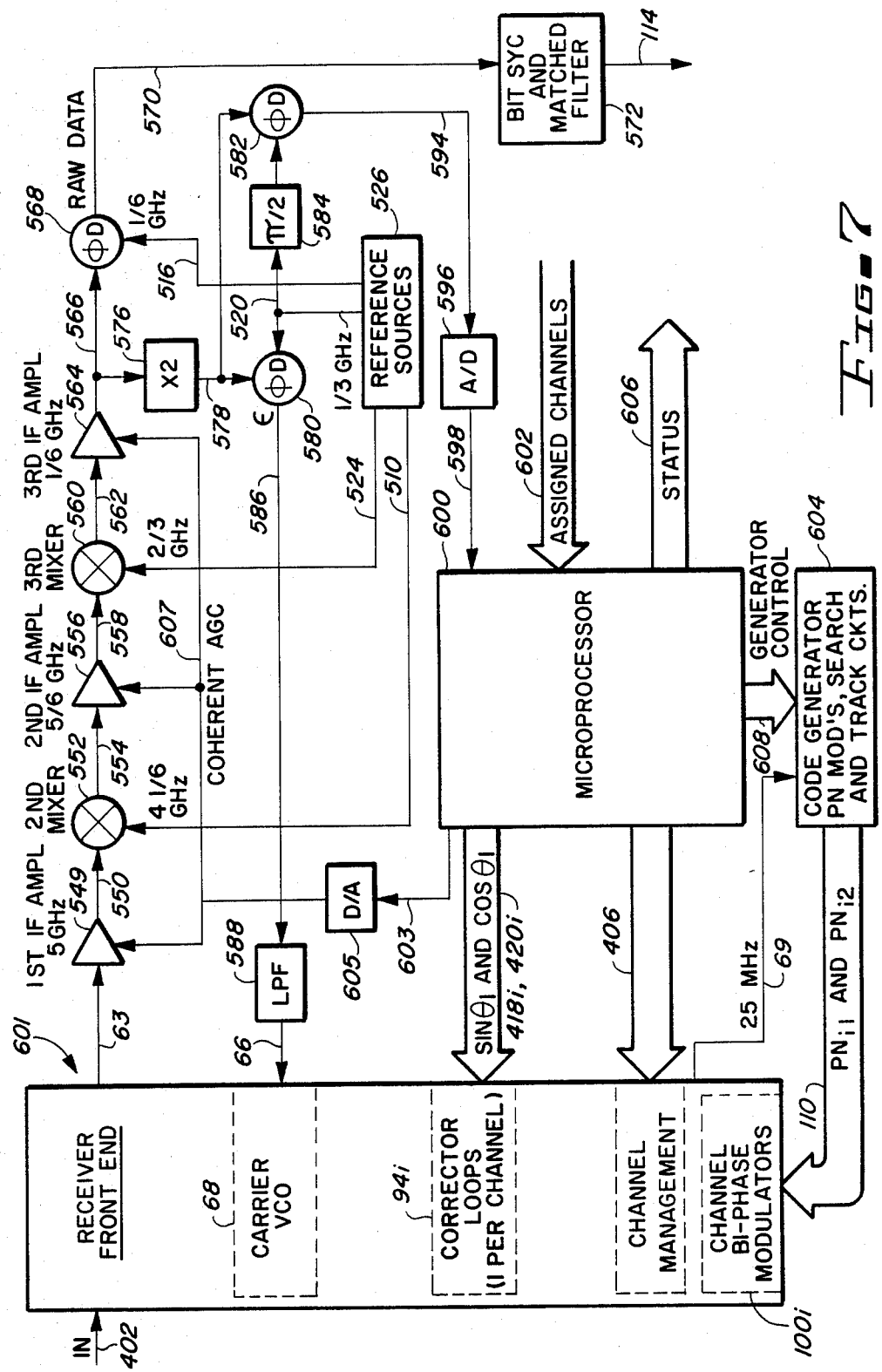
FIG. 7 is a more detailed block diagram of the receiver of FIG. 1.

FIG. 7 represents an overall block diagram of the 22 receiver which may be used in the system of the invention. Input signal 402 (from antenna 52, and which may be fed through an amplifier 400, see also, FIG. 4) is fed to front end receiver 601 which produces a 5 GHz IF frequency on line 63. (See also FIG. 4 indicating that this is a composite IF frequency signal.) This composite 5 GHz signal is amplified in first IF amplifier 549 and produces amplified IF signal on line 550 which is fed to second mixer 552. Another input to second mixer 552 is a 4 1/6 GHz signal on line 510 from reference source 526. (See FIG. 6 for detail.) The output of second mixer 552 is a 5/6 GHz signal on line 554 which is fed to second IF amplifier 556. The output of amplifier 556 is 5/6 GHz signal on line 558. The signal on line 558 is fed to one input of third mixer 560. A second input to third mixer 560 is a $\frac{2}{3}$ GHz signal on line 524, from signal reference source 526. The output of third mixer 560 is on line 562 and this 1/6 GHz signal is fed to third IF amplifier 564. The output of third IF amplifier 564 appears on line 566 and is fed to phase detector 568 and to $\times 2$ multiplier 576. A second input to phase detector 568 is a 1/6 GHz signal on line 516 from reference source 526. The output of phase detector 568 is raw data on line 570. This raw data is fed to bit synch and matched filter 572 whose output is on line 114 and is the data output of the system. The output of times two multipler 576 appears on line 578 and is fed to error phase detector 580 and to phase detector 582. A $\frac{1}{3}$ GHz signal on line 520 from reference spurce 526 is fed to a second input of phase detector 580. This $\frac{1}{3}$ GHz signal on line 520 is also fed through 90° phase shifter 584 to a second input of phase detector 582. The output of phase detector 580 is fed through low pass filter 588 on line 66 to carrier VCO 68. This is $\epsilon$, the carrier error signal and it is also shown in FIG. 1. The output of phase detector 582 (a coherent amplitude detector due to the 90° phase shift) appears on line 594. This signal is fed to A/D converter 596 and from there on line 598 to microprocessor 600. Digital information which informs microprocessor 600 of the assigned channels appears on multichannel bus 602. These channels may be manually set or they may be a function of the received interference on existing channels; that is, the frequency agility aspect of the system may be exercised at this point. Channels may be ignored as a function of their noise levels or many be switched to new frequencies if a reverse link to the transmitter is available. One output of microprocessor 600 is a coherent agc signal in digital form on line 603. This signal is fed to D/A converter 605 and thence to first if amplifier 549, second if amplifier 556, and third if amplifier 564, all on line 607. Microprocessor 600 generates sin $\theta$i and cos $\theta$i signals on buses 418$_i$ and 420$_i$. These signals are sent to corrector loops 610 in the receiver front end. Status bus 606 provides status information for each channel. This information may be used to control transmitter channel selection in a two-way system. Bus 608 provides microprocessor control for the code generator PN modulation search and track circuits 604. The outputs of circuits 604 are on bus 110, PNi1 and PNi2 which are fed to the channel biphase modulators 428$i$ and 430$i$ (see FIG. 4) A 25 MHz MHz reference signal is fed from receiver front end 601 on line 69 to code generator 604.

Code generator 604 is shown in more detail in FIG. 8: 25 MHz signal on line 69 from carrier tracking VCO 68 (see FIGS. 4, 8) is fed to code clock acquisition and corrector loop 104, power splitter 706. A first output of power splitter 706 on line 710 is fed to mixer 708. A second output of power splitter 706 is fed on line 716 to $\pi/2$ phase shifter 714. The output of phase shifter 714 is fed to multiplier 718 by way of line 720. Search circuits and patterns 702 receives a search rate signal on line 704 from oscillator 700. The oscillator rate is from 10 to 50 kilochips per second. Bus 608 feeds clock loop filter and integrator search control signals from microprocessor 600 (see microprocessor 600, FIG. 7) to block 702. Search circuits and patterns block 702 feeds sin $\theta_c$ signal on line 722 to a second input of multiplier 718. Block 702 also feeds a cos $\theta_c$ signal on line 712 to a second input of multiplier 708. The output of multiplier 708 is fed to one input of summing circuit 724 while the output of multipler 718 is fed on line 728 to a second input of summer circuit 724. The output of summer circuit 724 is a clock signal on line 106 which is fed to spread spectrum code generator 730, a part of PN generator circuit 108. These circuits 104 comprise a single side band modulator providing for code clock offset equal to search rate, up or down, for code search and acquisition purposes. The output of spread spectrum code generator 730 is fed on line 734 to PN modifiers 732$i$1 and 732$i$2. (It will be understood that there are 20 pairs 732$i$1 and 732$i$2.) The outputs of PN modifiers 732 are fed on bus 110$i$ to the channel biphase modulators 100$i$ of FIG. 7. (These are the same as the N spread spectrum modulators 100$i$ shown in FIG. 1 and PN biphase modulators 432$i$ and 428$i$ of FIG. 4.)

A typical digital subsystem loop is shown in FIG. 9. The coherent amplitude sum signal from the receiver is transmitted on line 594 to A/D converter 596. A to D converter 596 digitizes the signal to 6 bit resolution. The digitized signal is the input for all digital loops. During the period (one-half millisecond long occurring at one millisecond intervals) a particular Walsh function dithers the phase angle of its matching local oscillator signal by about ±20° producing a modulation in the amplitude of the coherent IF signal in accordance with that of the Walsh function pattern. The same Walsh function provides a switching operation (equivalent to multiplication) in the matching channel correlator 800$i$. The output of correlator 800$i$ summed over the one-half millisecond duration of the Walsh function is a measure of the phase error associated with the local oscillator signal. Other local oscillator signals are dithered by other Walsh functions from the same set during the same one-half millisecond.

The 20 channels of the described system are divided into group A (ten channels) and group B (ten channels). During a first 0.5 millisecond time period, the ten local oscillators of group A are dithered by ten Walsh functions of a 32 Walsh function set. (Of course, it will be understood that a Walsh set comprising a 16 code set would suffice.) At the same time, one selected channel from group B is tested for quality (signal strength) at the output 805$i$ of correlator 800$i$. In the next 0.5 milliseond time period, the ten channels of group B are dithered along with a selected channel from group A, which is tested for quality. In successive 0.5 millisecond intervals the system continues to alternate between Walsh function dithering of the group A and group B signals with a *different* one of the other group included in each time period for a quality test. It may be seen that in ten milliseconds, each of the 20 signals is tested once for quality and all signals are dithered ten times each for phase error. While either group is being dithered, the other group is subjected to loop calcualtions based on the result of dithering in the prior 0.5 millisecond period. Therefore, each of the twenty local oscillator signals is corrected once each millisecond for phase error and all twenty signals are tested for quality in a ten milliscond time frame.

FIG. 12 shows in some detail how dithering allows both phase and quality measurements simultaneously. First, note that the signal represented by vector 900 has a zero phase. Dithering signal 906 (shown here for simplicity as a simple sine wave) causes a plus (+) 20 degree translation 902 of the vector for a full positive input, a negative (−) translation of 20 degrees 904 for a negative signal input and no translation 900 for a zero input. The amplitude modulation of vector 900, 902, 904 appears as waveform 908. Note that where dithering waveform 906 is designated as frequency, f, the amplitude modulation 908 resulting therefrom is 2f. There is no component f of the dithering waveform in the modulated waveforms 908. This may be confirmed by noting that there are two full cycles of signal 908 within the time T, 910, required for one full cycle of dithering signal 906.

By utilizing the Walsh function characteristics described by H. F. Harnmuth in "Transmission of Information by Orthogonal Function", Springer/Verlag, Berlin/New York, 1970, the ten phase measurements may be made simultaneously without cross-talk problems. The same Walsh function which is used on line 820$i$ (see FIG. 9) for dithering is also introduced in correlator 800$i$ and is multiplied therein by all Walsh functions from A/D converter 596. Only the information in the signal of interest will correlate and provide a timing error signal through switch 808$i$ to filter 802$i$.

The signal for which quality is measured, supra, in each 10 millisecond time period, is first shifted 90° in phase shifter 816$i$ (FIG. 9). This is shown in vector form in FIG. 12. Vector 912 is shown shifted 90° ($\pi/2$). This vector is then dithered by ±20°, as was done with the previously described signals but using a unique Walsh function so that it may be separately identified. If the vector has an amplitude as shown at 914, the peak amplitude of the resulting modulation will be $A_1$, as shown. If the vector has an amplitude as shown at 916 the resulting modulation has an amplitude equal to $A_2$, as shown. It may be seen, then, that the modulation amplitude is clearly a function of the amplitude of the modulated signal. Since all signals are checked for amplitude in a ten millisecond period, the largest signal may be identified once in each ten millisecond period.

One additional loop is required to get a phase measurement on the code clock for a total of 12 loops and 12 Walsh functions from the selected set. The code clock phase measurement may be pipelined with the calculations indicated in FIG. 9. The quadrature rotated signal bears no relation to the phase error and its introduction into the loop filter is prevented by switch 808$i$.

The orthogonal character of the members of the Walsh function set allow each correlator to extract the local oscillator phase error unique to each loop. The dither of other loops during the same time produces zero mean noise in each of the correlators which is subsequently removed by low pass loop filter 802$i$ in each loop. Walsh function store 804$i$ is utilized to provide the dither (32 chips/word, 64K chips/second) on line 806$i$ to correlator 800$i$ and on line 820$i$ to switch matrix 822$i$. Low pass filter 802$i$ is connected to the output of correlator 800$i$ by means of switch 808$i$. The output of low pass filter 802$i$ is fed via switch 810$i$ to integrating circuit 812$i$. Loop filters 802$i$ and integrators 812$i$ are digitally implemented. The output of each integrator 812$i$ is a loop correction phase angle which shifts the local oscillator signal phase by means of the front end local oscillator mixers 412$i$, 416$i$ (FIG. 4). The angle signal on line 814$i$ from integrator 812$i$ is fed to store sin/cos 816$i$. The digital values for this storage are supplied from sin/cos look-up 818$i$. The required sine and cosine functions of the phase angle, which are obtained in digital form from lookup table 818$i$, are latched to appropriate voltages after D/A conversion. The sample rate of the correction loops is 1000 samples per second enabling loop band widths of about 100 Hz. Switch 810i at the input of loop integrator 812i is normally set to connect low pass loop filter 802i. In this position the loop is considered active. It is apparent that in the narrow band sense the phases of the set of local oscillator signals is overdetermined. In the example system, there are 20 phases to be determined and there are 20 corrector loops and the main carrier loop which interact to set the zero frequency values of the phases. The interaction may proceed in this way: the main carrier VCO loop may drift in one direction carrying all phases with it and the 20 correctors could all move in the opposite direction to remove the VCO drift. All would operate satisfactorily until the VCO encountered one or the other of its stops. This would render the system unable to cope with wideband phase information such as rapid Doppler changes. This state of affairs is prevented by removing the overdetermination. On the basis of corrector loop signal quality a best (or adequately good) loop is selected and the switch into integrator 812i is grounded. This disables that corrector loop allowing the VCO to provide all phase correction for that local oscillator signal. The remaining corrector loops then correct phase error (in the narrow band sense) with respect to the loop with the grounded integrator 812i input. As signal conditions change, the ground can be removed from a deteriorating loop and transferred to one which has become adequately good. In any event, there must always be one less active corrector loop than active channels. The channels, due to sufficiently poor signal quality in the corrector loops, can be declared non-contributory and then disabled, as discussed, supra. Disabling a channel in the receiver is easily accomplished by setting the two D/A inputs to zero for that particular local oscillator signal. This effectively removes the local oscillator signal and deletes the channel signal from the coherent sum input to the IF amplifier.

The switch 808i at the input to loop low pass filter 802i is open when signal quality in a loop is measured. This measurement occurs, as indicated in Table I below, and in FIG. 9, at 1/10 the rate of the phase error measurements.

TABLE I

| LOOP(S) | CHARACTERISTIC | RATE OR BW | IMPLEMENTATION |
|---|---|---|---|
| Carrier(1) | Acquisition BW | ¼ to 2 MHz | Conventional |
|  | Tracking BW | 10 to 50 KHz | Analog (VCO) |
| Phase Correctors (20) | Error Sample Rate | 1K Sample/Sec | Digital* Microprocessor |
|  | BW | 100 Hz |  |
| Code Clock (1) | Error Sample Rate | 2K Sample/Sec | Digital* Microprocessor |
|  | BW | 100 Hz (+Rate Aiding) |  |
| AGC(1) | Sample Rate | 100 Samples/Sec | Digital* Microprocessor |
|  | BW | 10 Hz |  |

*Local internal carrier for all digital loops, 64 K chips/sec - Walsh functions

OPERATION OF THE SYSTEM

Data is sent simultaneously on several, say n, coherently related signals in n channels. Each of the n signals is spread with a different spectrum spreading code. Each of the n signals, upon reception, is despread by its mating code reference and the despread signals are coherently combined prior to detection. Being a coherent system, it is necessary to provide carrier tracking for all of the n despread carriers in use. This is accomplished by a single dynamically capable phase locked loop of the conventional analog type. At the transmitter, the clock for all of the spreading functions is coherent with the n channel carriers. This coherence is maintained in the receiver so that a dynamically capable code clock loop is not required. All dynamics are tracked by the single carrier loop in the receiver.

A number of other loops are required in the receiver. Except for the AGC loop, these arise from phase corrections that must be made to avoid destruction of the coherence relationships. These loops are a single code clock correction loop and a carrier phase correction loop for each of the n carriers. These loops and the AGC loop may be implemented with time shared digital hardware with most of the functions implemented in software or firmware. All digital operations are narrow band processes; allowing low sample rates and time sharing. These operations can be narrow band because the wide band operation, dynamic carrier tracking, has been effectively isolated from all other operations by an arrangement for generating transmitter carriers and receiver local oscillator signals.

The chosen signal channels may be contiguous or non-contiguous, or even overlapped, where required by spectrum availability considerations. Overlapped channel operation is facilitated by the unique spectrum spreading modulation of each channel. (The term "non-contiguous" will be understood to include the "overlapped" condition, herein.) Different spreading codes prevent an eavesdropper from using correlation techniques to find the frequencies of the n channels in use. The spreading functions are related in that the clocks for each are the same (coherent) and the codes are all relatable. However, the relationships are what might be called one-way functions, thereby preventing exploitation by others. The preferred embodiment of the system utilizes a master code generator whose output is modified 40 different ways to produce the required 40 spreading and 40 despreading codes. However, it will be understood that 40 different code generators (for generating 40 different codes) could be used. These generators would be related timewise by means of a common clock, a common starting time and with known initialization states.

It may be evident that, since the same data is conveyed on each channel, various of the channels can be lost without rendering the system inoperative. This leads to the system characteristic that channels which are jammed or lost for other reasons (such as shut down at the transmitter due to failure or because of interference with some other operation) can in two-way systems or on the basis of predetermined planning be shifted to other channels. This slithering of channels can be accomplished dynamically without system interruption.

The arrangement alluded to, above, concerns the development of the several carriers for the different channel signals and the development of the corresponding local oscillator signals in the receiver. Only these carriers and local oscillator signals will be considered, immediately below:

The general arrangements for the transmitter, FIG. 10, and receiver, FIG. 11, are:

There are the same number of channels, N, at both transmitter and receiver. Hence:

$$N = n - m = q - p \quad (1)$$

where: $n-m$ = number of transmit channels, $q-p$ = number of receive channels.

The first mixer operation in the receiver (FIG. 11):

$$IF = LO - (mf_o \text{ to } nf_o) \quad (2)$$

since:

$$LO = (pf_v \text{ to } qf_v) + f_{os}$$

then:

$$IF = (pf_v + f_{os} - mf_o) \text{ to } (qf_v + f_{os} - nf_o)$$

where:
- IF = receiver first intermediate frequency;
- LO = local oscillator frequencies (receiver);
- $f_o$ = reference frequency (transmitter);
- $f_{os}$ = offset frequency (receiver); and
- $f_v$ = VCO frequency (receiver).

The coherence condition; the IF must be same for any two channels:

$$pf_v + f_{os} - mf_o = qf_v + f_{os} - nf_o \quad (3)$$

Or:

$$(n-m)f_o = (q-p)f_v$$

Using (1) in (3) gives:

$$f_o = f_v \quad (4)$$

A relative velocity, V, between transmitter and receiver changes each received frequency by a factor, $(1+\beta)$, where $\beta = V/C$, C=velocity of light. This is equivalent to changing $f_o$ to $f_o(1+\beta)$. From (4) $f_v$ must change to $f_o(1+\beta)$. Equation (2) becomes:

$$IF = pf_v(1+\beta) + f_{os} - mf_o(1+\beta); \text{ but} \quad (5)$$

$$IF = pf_v + f_{os} - mf_o, \text{ when } V = 0. \quad (2)$$

Subtract equation (2) from equation (5)

$$0 = pf_v\beta - mf_o\beta \quad (6)$$

Using (4) again:

$$p = m \quad (7)$$

Using (7) and (4), (2) may be written as:

$$OF + mf_of_{os} - mf_o \quad (8)$$

Or:

$$IF = f_{os}$$

The above states that for coherent Doppler tracking of N coherently related channels with one VCO, three conditions must be satisfied:

I. $f_v = f_o$ \quad (4)

II. $m = p$ (and hence $n = q$) \quad (7)

III. $f_{os} = IF$ \quad (9)

(Hence $f_{os}$ must not be derived from the $(1+\beta)$ shifted $f_v$).

These conditions result in:

$$LO = (m \text{ to } n) f_v + IF \quad (10)$$

Unfortunately, relationship (10) places a strong signal, $f_{os}$, internal to the receiver and at the input frequency of the IF amplifier, a very sensitive point, which requires unattainable (in a practical sense) isolation. However, this situation is avoided by properly scaled frequencies provided the three conditions are satisfied:

$$LO = k[(m \text{ to } n) f_v/k + IF/k] \quad (11)$$

When the LO signals are formed in this way, the dynamics in all or any subset of the N channels can be tracked by a single phase locked loop driven by the coherent sum of the IF signals.

There are unavoidable non-coherent effects among the channels. These arise from:
1. Instrumental effects: Primarily thermally induced phase shifts in the individual channel portions of both the transmitter and the receiver, and
2. Propagation effects: Due to dispersion among the channel frequencies.

However, these are very narrow band processes and can be compensated (or corrected) by narrow band digital corrector loops. Digital implementation is enabled only if a dynamically capable phase locked loop tracks the dynamics of all channels at once. The derived relationship, equation (11), enables digital implementation of the corrector loops.

It is reasonably evident that the channel phase shifts caused by thermal effects or aging at either the transmitter or receiver are indeed very narrow band effects. The narrow band nature of propagation dispersion differences among the channels is much less evident. Unfortunately, the literature, as applicable to the present problem, is not very extensive. A recent (1981) review article by R. L. Bogusch, F. W. Guiglians, D. L. Knepp and A. H. Michelet, "Frequency Selective Propagation Effects on Spread Spectrum Receiver Tracking", Proceedings of the IEEE, Vol. 69, No. 7, pps. 787–796, July 1981, is probably the best starting point available. Using the data presented in this article, it can be deduced that the phase scintillation at frequencies of interest (I and J band) would have 3 $\sigma$ values of perhaps six degrees with rms values of about two degrees in a bandwidth of about 1 Hz if the relative velocities are about Mach 1. The bandwidth increases with velocity. This data, although meager, is taken as indicating that the propagation dispersions, while requiring correction, present no limitations in the frequency ranges of probable interest.

On the basis of the development, above, broad outlines of one embodiment of a system may be derived. FIG. 1 incorporates the essential functions and relationships. It can be seen that reference oscillator 24 provides the reference for a bank of synthesizers 26 as well as clock 27 for spread spectrum generator assembly 32. This forces coherent relationships among all the N channel carriers and the code clock. A unique code and the common data stream modulate each of the N carriers. The modulated carriers are then combined (summed) 44 and amplified 46 for transmission 50. It should be noted that, while the N channel signals are coherently related, they are not coherent in the sense that would allow coherent combining. They are each on a different assigned frequency. Hence, simple summation 44 is accomplished at low level if handled in the manner of the diagram.

The receiver, which must do the processing to obtain interference resistance, is functionally more complicated than the transmitter. FIG. 1 shows receiver 22, for the system of the invention, to about the same degree of detail just exhibited for transmitter 20. Functionally, a fairly conventional (and fully coherent) receiver 22 would perform its normal operation. The additional complexity to achieve the additional functions of the invention are introduced in the "front end" including the development of multiple LO signals 112$i$. It should be noted that there is a single carrier VCO 68, a part of the dynamic carrier tracking phase locked loop, which supplies reference signals 70, 71, to local bank of synthesizers 72 as well as to clock 104 for spread spectrum generator 108. Reference or offset oscillator 78 is required. It hetrodynes, in mixers 82$i$, with the outputs 74$i$, of each of synthesizers 72. Offset oscillator 78 is at some sub-multiple of the intended first intermediate frequency 63 of receiver 22. Synthesizer 72 outputs 74$i$ are at the same sub-multiple of the N received carriers of the N channels. Following the multiple offset function, each of the signals are multipled coherently 86$i$ to become the needed N LO carriers 88$i$. Each of the signals passes through phase shifters 90$i$ which are individually controlled to compensate for the non-coherent effects associated with each channel. Finally, each LO carrier 98$i$ is spread 100$i$ by the appropriate function from spread spectrum generator 108 so that the proper N despreading references 112$i$ are created. Each of these is a reference for a mixer 58$i$ and all mixers 58$i$ have the total input signal on their signal input side 56$i$. Outputs 60$i$ of all mixers 58$i$ are the same signal at the same IF. They are properly coherent and may be summed 62 without energy penalty.

There are two important and unusual features in receiver 22. The first, which is the simple dynamic carrier tracking loop for all channels, is, at least, indicated in this level of block diagram. The second feature which enables the first to satisfy the total dynamic needs is the group of N narrow band corrector loops 94$i$ which drive N phase shifters 90$i$ in the LO chains.

It should be noted that a number of reference signals are required. They are all obtained from offset reference oscillator 78 so that no tracked Doppler will appear on any of them. The only signals in receiver 22 which replicate the doppler on the incoming signals are the LO carriers 88$i$ and code generator clock 104. These have the Doppler represented so that no Doppler appears anywhere in receiver 22 after first mixers 58$i$. This is the only way that the Doppler (or dynamic) tracking can be handled so that correction loops 94$i$ can operate with no Doppler and be truly narrow band.

In the present system all N channels, or any subset, are summed coherently to yield the output data. Any channel that doesn't make a useful contribution to the coherent total can be deleted at receiver 22. Channels that have been deleted can be tested for possible reinstatement. In two-way communication systems (probably the usual case) non-useful channels can be moved or re-selected without system interruption.

Suppose, as an example, that a system with twenty channels is designed with a total excess power of 25 dB above that for interference free communication with the coherent combination of all twenty channels. The excess power for each channel considered separately is a comfortable 25 dB − 13 dB = 12 dB (for the 20 channel case).

For effective interference, all N (=20) channels must be affected by uniform application of interference resources. If only one channel is missed, the N=19 affected channels can be automatically dropped by receiver 22 and no system interference occurs. No amount of interference will overcome any channel oversight.

The present system introduces a new dimension in its ability to react adaptively to interference by using excess radiated power in a smart rather than a brute force manner.

A preferred embodiment of the system has been laid out so that the unique portions may be exhibited. This system should be considered approximately typical for the range of problems which motivated the inventive concept. It is cautioned that the particular implementation chosen is only one of many that might have been chosen and may be improved upon by more design and development effort.

The operational characteristics of the example system have been dictated by an assumed set of requirements:

The Task: data rate of 0.5 MBIT/Sec. with Bit Error Rate (BER)≦$10^{-5}$.

The "Frequency Management" capability: The system operates in the 12-16 GHz range in negotiated channels of Band Width (BW)=50 MHz. (80 channels in the operating range.)

The interference scenario dictates some combination of two quantities (Processing Gain and Power). The selected mix is:

System Processing Gain: (equivalent to) Occupied BW=1 GHz total, equivalent to 20 channels or 25% of operating range.

Total Radiated Power: 25 dB above the interference free communication minimum. (This is on the low or conservative side of the range of present and projected systems);

Certain characteristics of the system can be derived from the assumed requirements. The spread spectrum chip rate for each occupied channel is 25 Mchip/s which leads to a 50 MHz null-to-null bandwidth. The processing gain per channel is given by chip rate/data rate=25 Mchip/0.5 Mbit=50 or 17 dB. The processing gain for the coherent sum of 20 channels is 13 dB. Hence, the system processing gain is 17+13=30 dB, a fairly typical value, but not presently available for fractional megabit data rates. It should be noted here that while the concept of system processing gain will be used for descriptive and comparative purposes, it is not a meaningful parameter for the system of the invention. The reason for this statement will become apparent in the comparison with competing systems documented, infra.

The minimum system signal to noise (S/N) ratio for a BER of $10^{-5}$ is $E_b/N_o$=9.6 dB. (Coherent and no Error Correction Coding (ECC).) The system $E_b/N_o$ with no interference is 9.6+25=34.6 dB. The single channel $E_b/N_o$ with no interference is 34.6−13=21.6 dB. The excess radiated power for each clear channel is 21.6−9.6=12 dB.

The equivalent very wideband single channel system would have a null-to-null BW of 1 GHz, produced by a Spread Spectrum (SS) code rate of 500 Mchips/sec. The processing gain of this equivalent system would be 500 Mchip/0.5 Mbit=1000 or the same 30 dB. From this it is readily seen that there is no loss or gain compared with an equal total bandwidth single channel coherent system. However, it will become evident that there are great differences in the "Frequency Management" and survivability aspects of the present system and its equivalent single channel system. The bandwidth and chip rate of the equivalent system are the two main reasons why 30 dB processing gain systems do not exist for large fractional megabit data rate applications.

Transmitter

In operation, it may be seen that the transmitter may be used to produce 20 simultaneous coherent channels of data which are PN coded according to a master code but modified according to 20 different pairs of hard-wired PN modification codes. The fact that these modification codes are predetermined will be utilized in the receiver in order to demodulate the data from the signals. It is important to note that the composite transmitter signal is coherent with respect to the reference source, that the 20 channels may be transmitted simultaneously, and that each of the channels has a unique PN code which is related to the master code it a known way. It is also important to understand that each of the 20 channels contributes a predetermined 1/20 of the power (in this example) which is being transmitted. This power level is set to allow valid demodulation of the data on any single channel in the absence of all others. This assumes, of course, that there is no noise present in the transmitting environment which would mask the particular channel. However, it should also be understood that it is very unlikely that all 20 channels would be interferred with simultaneously. This means that the probability of successful transmission in the presence of anything but extremely wide band noise is very high.

A block diagram of the example transmitter is shown in FIG. 2. A single frequency standard 24 supplies coherently related reference signals and clocks for all functions in the transmitter. Synthesizer group 26 is a set of 20 identical synthesizers which can be set to any of the channels in the 12–16 GHz operating range. Each of these channel carriers is split 208$i$, into in-phase 209$i$ and quadrature 211$i$ signals for bi-phase modulation 210$i$, 214$i$, by spreading codes 236$i$, 238$i$ combined with data 36. Re-combination 244$i$ produces channel signals 42$i$ that are quadriphase modulated with spreading codes 32 and are bi-phase modulated with data 36, which is common to all channels. Re-combination of all N channels is accomplished in summing circuit 44.

The processing gain per channel in the receiver is fairly low (17 dB) and simple squaring has been selected to recover the carrier phase error. Under these conditions, the quadriphase despreading modulation will prevent the squaring (to remove the data) from reconstructing an interferring carrier from an in band CW interference source. This is a satisfactory approach for a low processing gain coherent system.

In FIG. 2, the data is shown as exclusive ORed 230$i$, 232$i$ with the code streams, each of which is made unique by appropriate modifications (PN Mods) 222$i$, 224$i$ of spread spectrum code generation 32 output. The original concept was that the generator which should, of course, produce long complex codes, could be structured as a linear shift register generator with the requisite number of feed forward non-linear logic layers. Each of the PN Mods may then be an added non-linear logic module with a different key for each modulating stream (2 per each of the 20 channels for a total of 40).

The generator structure may be based on my work documented in "Generation of Binary Sequences with Controllable Complexity", IEEE Trans. on Info. Theory, Vol. 11-17, No. 3 pps. 288–296, 5/71. Each of the non-linear logic modules in the generator and each of the PN Mods may be as described in U.S. Pat. No. 4,325,129.

An additional detail of the transmitter is covered in FIG. 3. This is a preferred arrangement for one of the synthesizers in synthesizer bank 26, FIG. 2. It is essentially conventional with the possible exception that it must work over a very large frequency range. The main effect of this is that the multiplier from the VCO (338$i$) frequencies to the channel carrier frequencies 28$i$ must involve multiplication by small numbers; in this case only X2 multipliers 344$i$, 348$i$, 352$i$ are used. It should be noted that the design can be maintained at a somewhat unsophisticated level because there is no requirement for rapid shift from one channel to another.

Receiver

From the system overview presented earlier, it is evident that the principle complications introduced by the inventive concept appear in the front end of the receiver, particularly in the generation of LO signals. A first breakdown of receiver 22 front end is shown in FIG. 4.

The incoming signal 402, after sufficient amplification 400 to prevent significant degradation to the front end noise figure, is split 54 and fed to N first mixers 58$i$. Each of mixers 58$i$ is driven by an LO signal 112$i$ for each one of the N channels in use. After mixing, the N mixer outputs are all at the same (IF) frequency and are phase coherent, so that simple summing 62 produces the single composite first IF signal 63 into the first IF amplifier of receiver 22. (In this example, the first IF is 5 GHz, see discussion below.) It should be noted that while the total front end bandwidth (4 GHz) is input to each mixer 58$i$, only that portion correlating with a specific LO signal 112$i$ contributes to the coherent composite sum 63. All the other portions will result in noise which is out of the IF band.

Each of the LO signals 112$i$ starts from synthesizer 404$i$ and all N synthesizers in the group are referenced to common VCO 68, which is driven by the single dynamic phase locked loop from carrier phase error signal 66 developed in receiver 22. Each LO signal 408$i$ must be phase corrected by a narrow-band phase corrector loop. The phase shifts are introduced into each LO line 408$i$ through an in-phase 412$i$ and quadrature 416$i$ multiplier (linear mixer). These two signals are recombined 422$i$ to obtain a phase shifted LO signal 424$i$. Signal 424$i$ is then resplit 426$i$ into in-phase 428$i$ and quadrature 432$i$ components so that a quadriphase coded reference can be obtained. This arrangement is identical with that of transmitter 20 (FIG. 2) except that data is, of course, not introduced.

FIG. 5 shows one of the N receiver synthesizers in more detail; these are conventional and quite identical with the corresponding transmitter units. The major difference is in the introduction of the offset frequency from an isolated source 446 prior to the multiplication chain.

In accordance with the third rule of carriers and LO relationships which was developed earlier (see III, equation (9) supra), the offset frequency must not be subject to Doppler shifts. This, of course, extends to all other receiver reference frequencies since all such references are only implementation manifestations of each other. The receiver reference sources are shown in FIG. 6. The principal output is the 5/12 GHz offset frequency 446 which goes to all N synthesizers 404i, FIG. 5. All of the other reference signals, which supply the main receiver, are coherently related to this independent source.

The overall receiver arrangement is shown in FIG. 7 in block diagram form. The input to the first IF amplifier is at 5 GHz and is the coherent (vector) sum of signals from all N channels. Each of these has been despread but the data is, of course, still present in the form of phase reversals of the IF carrier. Hence, the design of the IF chain should, as the signal is amplified, narrow the bandwidth to match the data rate, i.e., to something not greatly exceeding 1 MHz. Since the IF chain starts at 5 GHz, it is appropriate to employ two more mixings to reduce the IF carrier to more manageable values.

The third IF (564) of 1/6 GHz is adequately low to incorporate adequate gain and narrow band filtering. The data is recovered in the normal fashion with phase detector 568 gated with the 1/6 GHz reference signal 516. The raw data is improved and clocked with conventional bit sync loop and matched filter 572.

The composite carrier phase error is recovered in a common and simple manner by squaring circuit (X2) 576, which effectively removes the data, followed by phase detector 580 against a double frequency reference 520 ($\frac{1}{3}$ GHz). The error signal 586 goes to the usual low pass loop filter 588 and then to carrier VCO 68. Coherent amplitude detection for all information which is carried by the amplitude of the composite carrier is obtained by another phase detector 582 with a $\pi/2$ radian 584 shifted double frequency reference 520. The information obtained is a composite of the amplitudes of the local carriers used to separate the various corrector loops. At this point only the A/D conversion 596 of the composite amplitude data 594 to a digital sampled data signal 598 needs to be noted.

Clock signal 106 for the spread spectrum generator (See FIG. 8) is coherently related to the channel carriers in the transmitter. This coherence is maintained in the received signals, being altered only by the Doppler and thermal drifts. Hence, for tracking the code clock in the receiver it is sufficient to coherently drive reference code clock 104 from Doppler tracking VCO loop signal 69. This is indicated in FIG. 8. The phase trimming of clock 104 and the correction of thermal drift is accomplished by another narrow-band digital loop in the same manner as the corrector loops for each of the local oscillator signals. During acquisition, it is necessary to advance and/or retard code clock 104 to obtain correlation. This is accomplished by adding or subtracting a suitable frequency offset 700, 704 to the coherently derived clock 104. Suitable search rates are in the 10–50 Kchip/sec. range. The offset may be obtained from a 40–200 KHz oscillator whose frequency may be divided by four to obtain a four phase signal for altering coherent clock 104 in a true single side band fashion.

While the invention has been particularly shown and described with reference to a preferred embodiment thereof, it will be understood by those skilled in the art that various other modifications and changes may be made to the present invention from the principles of the invention described above without departing from the spirit and scope thereof, as encompassed in the accompanying claims. Therefore, it is intended in the appended claims to cover all such equivalent variations as come within the scope of the invention as described.

I claim:

1. A communications system comprising in combination:

a transmitter further comprising:
 means for simultaneously transmitting a plurality of coherently related carrier signals in a like plurality of signal channels, said plurality of signal channels being one of contiguous and non-contiguous; and
 means for modulating at least two of said plurality of carrier signals with an identical information bearing modulation signal;

a receiver further comprising:
 means for receiving said plurality of coherently related carrier signals;
 a single dynamic, carrier tracking, phase locked loop coupled to said receiving means for maintaining all of the received signals coherent;
 means coupled into said phase locked loop for coherently combining said plurality of coherently related carrier signals; and
 means coupled into said phase locked loop for detecting said coherently combined signals.

2. The communications system according to claim 1 wherein said means for simultaneously transmitting further comprises:
synthesizer means for coherently generating said plurality of carrier signals.

3. The communications system according to claim 1 wherein said transmitter further comprises:
means for modulating each of said plurality of carrier signals with a spectrum spreading signal; and wherein said receiver further comprises:
means for despreading each of said plurality of spread spectrum carrier signals.

4. The communications system according to claim 3 wherein said means for modulating with a spectrum spreading signal comprises:
first means for generating separate and different spectrum spreading signals for each of said plurality of carrier signals in said transmitter.

5. The communications system according to claim 4 wherein said despreading means further comprises:
second means for generating said each of said separate and different spectrum spreading signals for adaptation as despreading signals in said receiver.

6. The communications system according to claim 5 wherein said despreading means further comprises:
means for generating a like plurality of local oscillator signals, each of said plurality of local oscillator signals being offset in frequency from a corresponding one of said carrier signals by a frequency equal to a predetermined intermediate frequency;
a like plurality of means for mixing one of each of said plurality of local oscillator signals with one of each of said plurality of coherently related carrier signals to produce a like plurality of coherent intermediate frequency signals, each of said plurality of local oscillator signals being coherent with respect to a corresponding one of said plurality of coherently related carrier signals and wherein said mixing means is disposed in said receiver prior to said detection means; and
means for coherently summing said like plurality of coherent intermediate frequency signals for producing a composite coherent intermediate frequency signal.

7. The communications system according to claim 3 wherein said despreading means further comprises:

a plurality of loop means for phase tracking each of said coherently related carrier signals.

8. The communications system according to claim 7 wherein each of said plurality of loop means further comprises a like plurality of orthogonal generating means, each of said like plurality of orthogonal generating means being used to produce one of a set of orthogonal functions, each one of said set of orthogonal functions being adapted to modulate a local oscillator signal and, thus, to identify a specific correction signal in a specific one of said plurality of loop means.

9. The communications system according to claim 8 wherein said modulation is by means of dithering a phase of said local oscillator signal.

10. The communications system according to claim 9 wherein said orthogonal functions are generated by digital means and wherein said modulation is accomplished by digital means.

11. The communications system according to claim 9 further comprising:

shifting means for shifting an element of said modulated signals by substantially ninety degrees; and means for measuring an amplitude variation of said shifted element, thereby yielding a measure of quality for a corresponding coherently related carrier signal.

12. The communications system according to claim 1 wherein said receiver further comprises:

means for tracking Doppler frequency offsets, and other frequency and phase errors that are proportional to frequency, in a single tracker, said single tracking means being responsive to said coherently combined plurality of carrier signals in said receiver.

13. The communications system according to claim 1 wherein said receiver further comprises:

means for generating and controlling a phase of a plurality of local oscillator signals corresponding in number to said plurality of coherently related carrier signals, for reducing short term errors, such as Doppler errors and other errors which are a function of frequency, in said coherently combined plurality of carrier signals, said generating and controlling means being responsive to said coherently combined carrier signals.

14. The communications system according to claim 13 wherein said receiver further comprises:

a plurality of narrow band means for correcting long term frequency drift in each of said plurality of local oscillator signals, each of said plurality of said narrow band means being responsive to an amplitude portion of said coherently combined signal.

15. The communications system according to claim 1 wherein said receiver further comprises:

means for generating and controlling the phase of a plurality of local oscillator signals corresponding in number to said plurality of coherently related carrier signals, for reducing short term errors, such as Doppler errors and other errors which are a function of frequency, in said coherently combined pourality of carrier signals, said generating and controlling means being responsive to said coherently combined carrier signals; and a plurality of narrow band means for correcting long term frequency drift in each of said plurality of local oscillator signals, each of said narrow band means being responsive to an amplitude portion of said coherently combined signal.

16. The communications system according to claim 15 wherein said means for coherently combining further comprises:

means for generating a like plurality of local oscillator signals, each of said plurality of local oscillator signals being offset in frequency from a corresponding one of said carrier signals by a frequency equal to a preselected intermediate frequency:

a like plurality of means for mixing one of each of said plurality of said coherently related carrier signals to produce a like plurality of coherent intermediate frequency signals, each of said plurality of local oscillator signals being coherent with respect to a corresponding one of said plurality of coherently related carrier signals and wherein said mixing means is disposed in said receiver prior to said detector means; and means for coherently summing said like plurality of coherent intermediate frequency signals for producing a composite coherent intermediate frequency signal.

17. The communications system according to claim 16 wherein said receiver further comprises:

a plurality of loop means for phase tracking each of said coherently related carrier signals.

18. The communications system according to claim 17 wherein each of said plurality of loop means further comprises a like plurality of orthogonal generating means, each of said like plurality of orthogonal generating means being used to produce one of a set of orthogonal functions, each one of said set of orthogonal functions being adapted to modulate a local oscillator signal and, thus, identify a specific correction signal in a specific one of said plurality of loop means.

19. The communications system according to claim 18 wherein each of said orthogonal functions are adapted to modulate one of said correction signals by means of dithering a phase of each of said correction signals, respectively.

20. The communications system according to claim 19 wherein said orthogonal functions are generated by digital means and wherein said modulation is accomplished by digital means.

21. The communications system according to claim 20 wherein said receiver further comprises:

means for tracking Doppler frequency offsets, and other frequency and phase errors that are proportional to frequency, in a single tracker, said single tracking means being responsive to said coherently combined plurality of carrier signals in said receiver.

22. The communications system according to claim 21 wherein said receiver further comprises:

means for generating and controlling the phase of a plurality of local oscillator signals corresponding in number to said plurality of coherently related carrier signals, for reducing short term errors, such as Doppler errors and other errors which are a function of frequency in said coherently combined plurality of carrier signals, said generating and controlling means being responsive to said coherently combined carrier signals.

23. A receiver for receiving a plurality of coherently related radio frequency signals, the plurality of radio frequency signals being one of contiguous and non-contiguous, the radio frequency signals each being modulated with an information bearing signal, said information bearing signals being identical each to every other information bearing signal, the receiver comprising:

a single dynamic, carrier tracking, phase locked loop for maintaining all of the received signals coherent;

means coupled into said phase locked loop for coherently and simultaneously combining at least two of the received radio frequency signals; and means coupled into said phase locked loop for detecting said combined signals, said means for detecting being responsive to said combined radio frequency signals subsequent to said combining.

24. The receiver according to claim 23 wherein said received plurality of radio frequency signals is modulated with spectrum spreading signals, each of said spectrum spreading signals being unique, the receiver further somprising:

means for simultaneously and coherently despreading said plurality of spread spectrum modulated radio frequency signals.

25. A receiver for receiving a plurality of radio frequency signals, the plurality of radio frequency signals being one of contiguous and non-contiguous, the radio frequency signals being modulated with spectrum spreading signals, each of said spectrum spreading signals being unique but related in a predetermined way to a master spectrum spreading signal, said received plurality of spread spectrum radio frequency signals being modulated with an information bearing signal, each of said information bearing signals being identical to every other information bearing signal, the receiver comporising:

means for simultaneously and coherently despreading said plurality of spread spectrum modulated radio frequency signals;

means coupled to said despreading means for coherently and simultaneously combining at least two of the received radio frequency signals; and means for detecting said combined signals, said means for detecting being operable on said combined radio frequency signals subsequent to said combining.

26. A receiver for receiving a plurality of radio frequency signals, the plurality of radio frequency signals being one of contiguous and non-contiguous, the receiver comprising:

a single dynamic, carrier tracking, phase locked loop for maintaining all of the received signals coherent;

means coupled into said phase locked loop for simultaneously and coherently combining said plurality of radio frequency signals; and means coupled into said phase locked loop for coherently controlling phases of a plurality of different local oscillator signals responsive to an average long term phase shift in the plurality of radio frequency signals such as shifts due to thermal, aging and dispersion effects.

27. A communications method comprising the steps of:

generating a plurality of coherently related radio frequency signals, said plurality of radio frequency signals being one of contiguous and non-contiguous;

modulating said plurality of radio frequency signals with a like plurality of information bearing signals, every one of said like plurality of information bearing signals being identical with every other one of said like plurality of information bearing signals;

combining said plurality of modulated radio frequency signals into a composite signal;

transmitting said composite signal to a receiver;

receiving said composite signal;

splitting said composite signal into a plurality of composite signals;

generating a like plurality of coherently related local oscillator signals, each of said plurality of local oscillator signals being offset in frequency by a predetermined intermediate frequency from a corresponding one of said plurality of radio frequency signals;

mixing each of said plurality of local oscillator signals with a different one of said plurality of composite signals to produce a plurality of converted composite signals;

summing said plurality of converted composite signals coherently;

amplifying and filtering said plurality of summed signals in an intermediate amplifier to produce a single information bearing signal; and detecting said information bearing signal coherently.

28. The method according to claim 27 further comprises the steps of:

spreading the spectrum of each of said plurality of radio frequency signals with a plurality of different spectrum spreading signals, each of said spectrum spreading signals being unique with respect to every other of said plurality of spectrum spreading signals; and despreading said plurality of spread spectrum radio frequency signals in said receiver to produce a despread converted composite signal.

29. The method according to claim 28 wherein said despreading step further comprises the steps of:

modulating each of the plurality of local oscillator signals with a like plurality of unique functions, each of said unique functions being related to all others of said plurality of unique functions orthogonally; and tracking a phase of each of said plurality of unique function modulated local oscillator signals in a plurality of phase locked loops to control a phase of each of said plurality of local oscillator signals to be coherent with a corresponding phase of a corresponding one of said received radio frequency signals by recognizing each of the plurality of loop signals by means of the orthogonal function modulated upon its corresponding signal.

30. The method according to claim 29 further comprising the steps of:

shifting the phase of at least one of said plurality of unique function modulated local oscillator signals substantially by ninety degrees, thereby shifting a corresponding element of said converted composite signal; and measuring an amplitude variation of said shifted converted composite element signal thereby yielding a measure of quality for a corresponding coherently related radio frequency signal.

31. A communications method comprising the steps of:

generating a plurality of radio frequency signals, said radio frequency signals being one of contiguous and non-contiguous;

modulating said plurality of radio frequency signals with a like plurality of spectrum spreading signals, all of said like plurality of spectrum spreading signals being different from every other one of said plurality of spectrum spreading signals, each of said plurality of spectrum spreading signals being modified from a master spectrum spreading signal in a predetermined way;

combining said plurality of modulated radio frequency signals into a composite signal;

transmitting said composite signal to a receiver;

receiving said composite signal;

splitting said composite signal into a plurality of composite signals;

generating a like plurality of coherent local oscillator signals, each of said plurality of local oscillator signals being offset in frequency by a predetermined frequency from a corresponding one of said plurality of radio frequency signals;

mixing each of said plurality of local oscillator signals with a different one of said plurality of composite signals to produce a plurality of converted composite signals;

amplifying and filtering said plurality of converted composite signals in an intermediate amplifier;

generating a plurality of spectrum despreading signals which are each identical, respectively, to each of said plurality of spectrum spreading signals;

applying each of said plurality of despreading signals to each corresponding one of said plurality of local oscillator signals for producing a plurality of local oscillator signals for despreading said plurality of spread spectrum signals;

despreading said plurality of spectrum spread radio frequency signals by means of said plurality of local oscillator despreading signals; and detecting said composite despread signals coherently.

32. A method for coherently combining a plurality of first coherently related signals comprising the steps of:

generating a first plurality of coherently related local oscillator signals;

generating an offset reference signal;

mixing each of said plurality of said first local oscillator signals in a mixer with said offset reference signal to produce a plurality of second local oscillator signals;

multiplying, coherently, each of said second local oscillator signals by a factor of k to produce a third plurality of local oscillator signals, said third plurality of local oscillator signals being coherently related to the first coherently related signals; and mixing each of said third plurality of local oscillator signals each with a corresponding one of said first plurality of coherently related signals to produce a plurality of coherent intermediate signals.

* * * * *